(12) United States Patent
Hosokawa

(10) Patent No.: US 8,510,691 B2
(45) Date of Patent: Aug. 13, 2013

(54) SEMICONDUCTOR VERIFICATION APPARATUS, METHOD AND PROGRAM

(75) Inventor: Kohei Hosokawa, Tokyo (JP)

(73) Assignee: NEC Corporation, Tokyo (JP)

( * ) Notice: Subject to any disclaimer, the term of this patent is extended or adjusted under 35 U.S.C. 154(b) by 99 days.

(21) Appl. No.: 13/120,622

(22) PCT Filed: Oct. 8, 2009

(86) PCT No.: PCT/JP2009/005241
§ 371 (c)(1),
(2), (4) Date: Apr. 20, 2011

(87) PCT Pub. No.: WO2010/041451
PCT Pub. Date: Apr. 15, 2010

(65) Prior Publication Data
US 2011/0191735 A1    Aug. 4, 2011

(30) Foreign Application Priority Data
Oct. 8, 2008 (JP) .................... 2008-262299

(51) Int. Cl.
*G06F 17/50* (2006.01)
(52) U.S. Cl.
USPC ........................................ 716/106
(58) Field of Classification Search
USPC .............................. 716/100, 106
See application file for complete search history.

(56) References Cited

U.S. PATENT DOCUMENTS
2005/0165597 A1* 7/2005 Nightingale .............. 703/27

FOREIGN PATENT DOCUMENTS
| JP | 10-10196 A | 1/1998 |
|---|---|---|
| JP | 11-206403 A | 10/1999 |
| JP | 2004280426 A | 10/2004 |
| JP | 2005174349 A | 6/2005 |
| JP | 2007527060 A | 9/2007 |

OTHER PUBLICATIONS
International Search Report for PCT/JP2009/005241 mailed Nov. 24, 2009.
Virtex-4 FPGA Configuration User Guide, XILINX Inc., UG071 (v1.10), Apr. 8, 2008.

* cited by examiner

*Primary Examiner* — Suchin Parihar

(57) ABSTRACT

A semiconductor device which can only load a logical value of an arbitrary memory element is rendered possible to allow a logical value of an arbitrary signal to be loaded at a high speed. A circuit diagram of the semiconductor device is input and a memory element required for calculating a desired signal is detected. The logical value of the memory element is loaded from the semiconductor device, and the logical value of the desired signal is determined in accordance with the logical value of the memory element and the circuit configuration.

23 Claims, 20 Drawing Sheets

Fig.4

SIGNAL:A
LOGIC:(FF_A) and (FF_B or FF_C)

SIGNAL:B
LOGIC: (omitted)

SIGNAL:INSTA/A
LOGIC: (omitted)

Fig.6

| instruction | value |
|---|---|
| device stop instruction | 0x300 |
| number instruction | 0x005 + number (32bit) |
| load instruction | 0x001 |
| device start instruction | 0x301 |

Fig.10

SIGNAL:A
ORDER:FF_A、FF_B、FF_C

Fig.14

```
; <offset> <frame address> <frame offset> <information>
Bit   38061 0x0000001d    13 Block=UK29 Latch=I Net=test/inst/signal_x
Bit   38098 0x0000001d    50 Block=UP50 Latch=I Net=test/inst/signal_y
```

Fig.16

| name of memory element | number information ||
| :---: | :---: | :---: |
| | first number | second number |
| A | 0x1024 | 0x20 |
| B | 0x0384 | 0x38 |
| C | 0x2578 | 0x01 |
| D | 0x1024 | 0x0A |

Fig.19

```
SIGNAL:A
LOGIC:(FF_A) and (FF_B or FF_C)

SIGNAL:B
LOGIC: (omitted)

SIGNAL:INSTA/A
LOGIC: (omitted)

FF_A:0x1024:0x1
FF_B:0x120:0x35
FF_C:0x1024:0x1D
```

SEMICONDUCTOR VERIFICATION APPARATUS, METHOD AND PROGRAM

The present application is the National Phase of PCT/JP2009/005241, filed Oct. 8, 2009, which claims priority based on Japanese patent application No. 2008-262299 filed on Oct. 8, 2008.

BACKGROUND OF THE INVENTION

1. Field of the Invention

The present invention relates to a semiconductor verification apparatus, method and program.

2. Description of the Related Art

With the development of semiconductor technology, an integration degree of a semiconductor device (logical Large Scale Integrated circuit (LSI)) is so improving every year that a large scale system can be integrated in one chip. Since the production cost of a semiconductor device is, however, becoming higher and a large amount of time is needed for producing the semiconductor device, it is important to execute sufficient verification before the production starts.

A verification of a semiconductor device is executed at various phases of the design. A design process takes many steps from a notional level at an initial design to a detailed production level at a final step, and handles logical information appropriate for each level. For example, logical information fit for the notional level to establish input-output relation or the like is handled at the initial design step, logical information fit for the function level to determine functions of each logic section is handled at the functional design step, and logical information fit for the structure level to determine logical structure is handled at the final detailed design step. The logical information fit for the aforementioned various design steps can be expressed with each type of hardware description languages (such as SystemC, SystemVerilog, Verilog-HDL, and VHDL) generally used.

As methods of verifying system logics using a semiconductor device or a plurality of semiconductor devices, there are a method with software simulators, a method with hardware emulators, and a method with actual semiconductor devices utilized. Software simulators can be used at various design steps because they run logical information described in hardware description language as a computer program. Furthermore, the software simulators have an advantage such that all of variable values in the hardware description language can be easily observed because they run behavior of circuits as a computer program.

Meanwhile, the actual semiconductor devices and the hardware emulators are hardware, and thus, they can run logical operation faster than the software simulators. The hardware emulators are devices which generally comprise rewritable hardware such as Field Programmable Gate Array (FPGA) and Field Programmable Interconnect Device (FPID). However, a problem with general semiconductor devices and hardware emulators is that they have difficulty in observing all signals due to cost constraints and hardware restrictions and so on, and difficulty in debugging circuits.

As a means for solving the problem herewith, disclosed is a technique for loading logical values of arbitrary memory elements implemented in FPGA without special support of hardware by controlling such a read-back function present in FPGA through JTAG (IEEE1149.1) as described in Patent Documents 1 and 2. Using the technique herein can help to drastically reduce the problem of an observability relating to the hardware emulators as described above.

Patent Document 1: Japanese Patent Application Laid-Open No. 2005-174349, paragraph 0055
Patent Document 2: Japanese Patent Application No. 2006-553063, paragraph 0085
Non-Patent Document 1: Virtex-4, Configuration Guide v1.10 published by Xilinx, Inc.

SUMMARY OF THE INVENTION

According to the hardware emulators described in the Patent Documents 1 and 2, disclosed is a technique for loading logical values of memory elements inside the FPGA by controlling FPGA with JTAG (IEEE1149.1). However, the problem with the hardware emulators described in the Patent Documents 1 and 2 is that they can load logical values of the memory elements inside the FPGA while they cannot acquire logical values of arbitrary signals inside the FPGA. In addition, a loading method is generally so complicated that it is difficult to speed-up operation.

An object of the present invention is to provide a semiconductor verification device, method and system for acquiring logical values of signals implemented in the semiconductor devices and hardware emulators at a high speed.

To achieve the object described above, a semiconductor verification apparatus of a first aspect of the present invention is an apparatus for loading a logical value of a signal in a semiconductor device using the semiconductor device which comprises loading means capable of loading from outside logical values of memory elements in the semiconductor device, the apparatus comprising:

memory element calculation means for calculating a logical formula in which the memory elements are used as logical variable number and the logical value of the signal described in the signal information based on signal information in which the signal in the semiconductor device is described and circuit information in which a logical structure in the semiconductor device and a relation of connection thereof are described;

loading control means for controlling the loading means to acquire the logical values of the memory element of the semiconductor device;

logical value calculation means for calculating the logical value of the signal described in the signal information based on the logical formula calculated by the memory element calculation means and the logical values of the memory elements acquired by the loading control means; and central control means for controlling the memory element calculation means, the loading control means and the logical value calculation means to obtain the logical value of the signal described in the signal information.

Using circuit information indicating logical structure of a circuit has allowed the semiconductor devices which can only load logical values of memory elements to extract logical values of all signals present inside the semiconductor devices.

Furthermore, by using circuit information indicating logical structure of a circuit, it is possible to extract memory elements necessary for logical computation. Deriving only logical values of these memory elements from semiconductor devices has allowed logical values of signals inside the semiconductor devices to be calculated at a high speed.

Meanwhile, a semiconductor verification method of a second aspect of the present invention is a method for verifying a semiconductor device by loading a logical value of a signal in the semiconductor device using the semiconductor device which comprises loading function capable of loading from outside logical values of memory elements in the semiconductor device, the method including:

calculating, by memory element calculation function, a logical formula in which the memory elements are used as logical variable number and the logical value of the signal described in signal information based on the signal information in which the signal in the semiconductor device is described and circuit information in which a logical structure in the semiconductor device and a relation of connection thereof are described;

controlling, by loading control function, the loading function to acquire the logical values of the memory elements of the semiconductor device;

calculating the logical value of the signal described in the signal information based on the logical formula calculated by the memory element calculation function and the logical values of the memory elements acquired by the loading control function; and controlling, by central control function, the memory element calculation function, the loading control function and the logical value calculation function to obtain the logical value of the signal described in the signal information.

Further, a semiconductor verification program of a third aspect of the present invention is a program for loading a logical value of a signal in a semiconductor device using the semiconductor device which comprises loading function capable of loading from outside logical values of memory elements in the semiconductor device, the program making a computer execute:

memory element calculation function for calculating a logical formula in which the memory elements are used as logical variable number and the logical value of the signal described in the signal information based on signal information in which the signal in the semiconductor device is described and circuit information in which a logical structure in the semiconductor device and a relation of connection thereof are described;

loading control function for controlling the loading function to acquire the logical values of the memory elements of the semiconductor device;

logical value calculation function for calculating the logical value of the signal described in the signal information based on the logical formula calculated by the memory element calculation function and the logical values of the memory elements acquired by the loading control means; and central control function for controlling the memory element calculation function, the loading control function and the logical value calculation function to obtain the logical value of the signal described in the signal information.

The program of the present invention is consisting of ordered list of instructions which are suit for the processes by the computer. As a main aspect for carrying out the program, the purpose is achieved by storing the program in a hard disk drive of a computer or a semiconductor memory, and making CPU implemented in the computer execute the instructions. In addition, it is apparent that an aspect for carrying out the present invention includes a case that the program is stored in a recording medium such as CD-ROM and DVD and it is possible to load it as needed.

The present invention has an advantage that semiconductor devices which can load logical values of the memory elements only can be rendered possible to calculate the logical values of all signals inside the semiconductor devices by using the circuit information. Only memory elements necessary for calculating logical values of desired signals are loaded from the semiconductor devices, and thus, it has an advantage that the amount of time taken for acquiring logical values of the signals can be reduced.

From the different aspect, logical values are calculated every time when memory elements are acquired, and the semiconductor devices behave so as to avoid the need for acquiring logical values of other memory elements in a case where logical values have been calculated. Therefore, it has an advantage that amount of time taken for acquiring logical values of signals can be reduced.

By properly controlling sequences of acquiring memory elements, it has an advantage that amount of time taken for acquiring logical values of signals can be further reduced.

By dynamically determining sequences of acquiring memory elements, it has an advantage that amount of time taken for acquiring logical values of signals can be further reduced.

The semiconductor devices are structured to previously store a control for input terminals of loading means necessary for loading logical values of memory elements in a first memory, and to cause its operation to control the loading means only by loading values from the first memory after rewriting only sections which are different according to the memory elements upon actually acquiring the logical values of the memory elements. Therefore, it has an advantage that amount of time taken for acquiring signals can be reduced.

The first memory and the second memory are directly connected to the loading means. Data per crock cycle are stored in the first memory while values output from the loading means are recorded per clock cycle in the second memory, thus the amount of time can be reduced to extract logical values of the memory elements from the semiconductor devices. As a result, it has an advantage that amount of time taken for acquiring signals can be reduced.

BRIEF DESCRIPTION OF THE DRAWINGS

FIG. 4 is an information list showing an example of memory element information 106 in the circuit configuration example corresponding to that in FIG. 3 showing a first invention pertaining to the present application.

FIG. 6 is an instruction list showing an example of loading unit control information 102 of a first invention pertaining to the present application.

FIG. 10 is an instruction list showing an example of acquisition order information 901 of a third invention pertaining to the present application.

FIG. 14 is a list extracted from data which relates to a number database 1300 provided by XILINX Inc. to be referred for showing a fifth invention pertaining to the present application.

FIG. 16 is a number list showing an example for explaining a sixth invention pertaining to the present application.

FIG. 19 is an instruction list showing an example of memory element information 106 of a sixth invention pertaining to the present application.

DETAILED DESCRIPTION OF THE PREFERRED EMBODIMENT

Next, detailed description is made of a preferred embodiment for carrying out the invention with reference to drawings.

Figure 1:
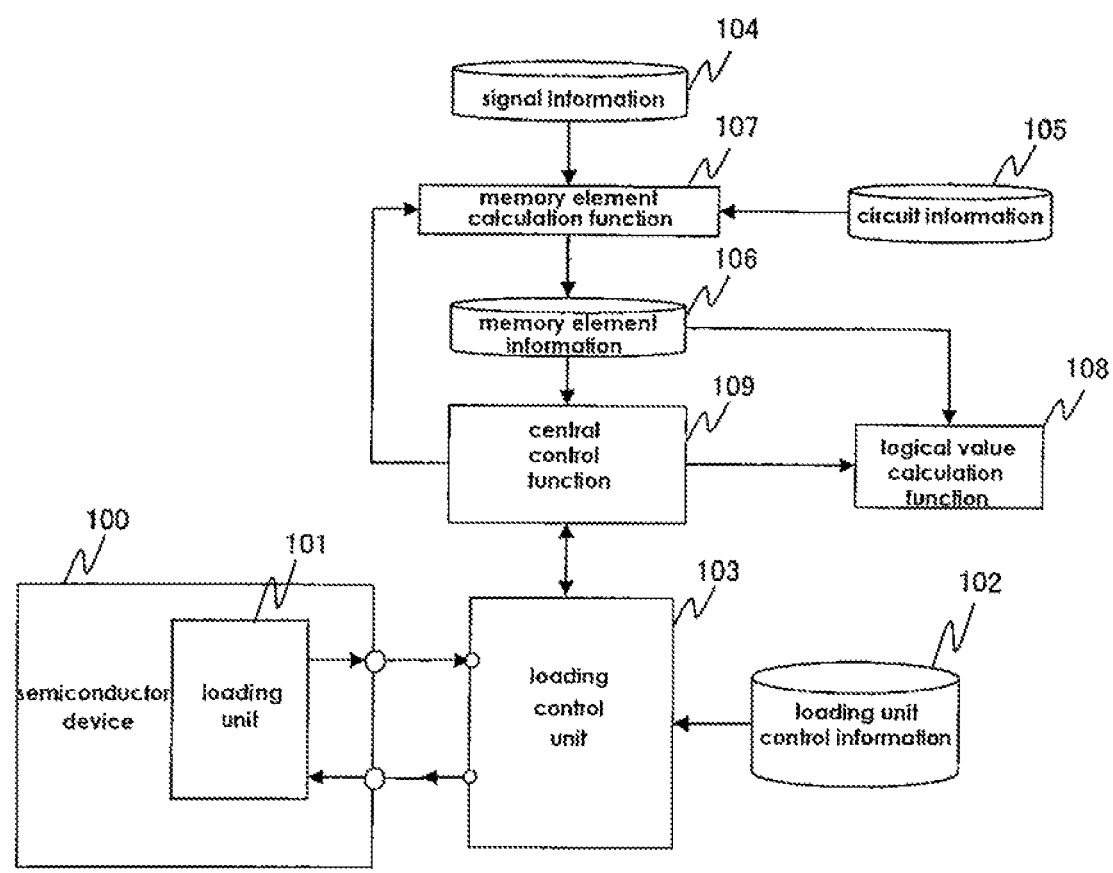
FIG. 1 is a block diagram showing a constitution in a preferred embodiment for carrying out a first invention pertaining to the present application.

Referring to FIG. 1, the first embodiment of the present invention includes:

a semiconductor device 100;

a loading control unit 103 which controls a loading unit 101 in the semiconductor device 100 based on a loading unit control information 102;

a memory element calculation function 107 which calculates memory elements and logical elements determining logical values of the signals (that is, 0 or 1) based on circuit information 105 for individual signals stored in signal information 104, and outputs these information as memory element information 106;

a central control function 109 which controls operations of the loading control unit 103, the memory element calculation function 107, and a logical value calculation function 108; and the logical value calculation function 108 which calculates logical values of individual signals stored in the signal information 104, from information stored in the memory element information 106 and logical values of individual memory elements acquired by the central control function 109 via the loading control unit 103.

Next, each constructional element will be described in more details.

Figure 2:
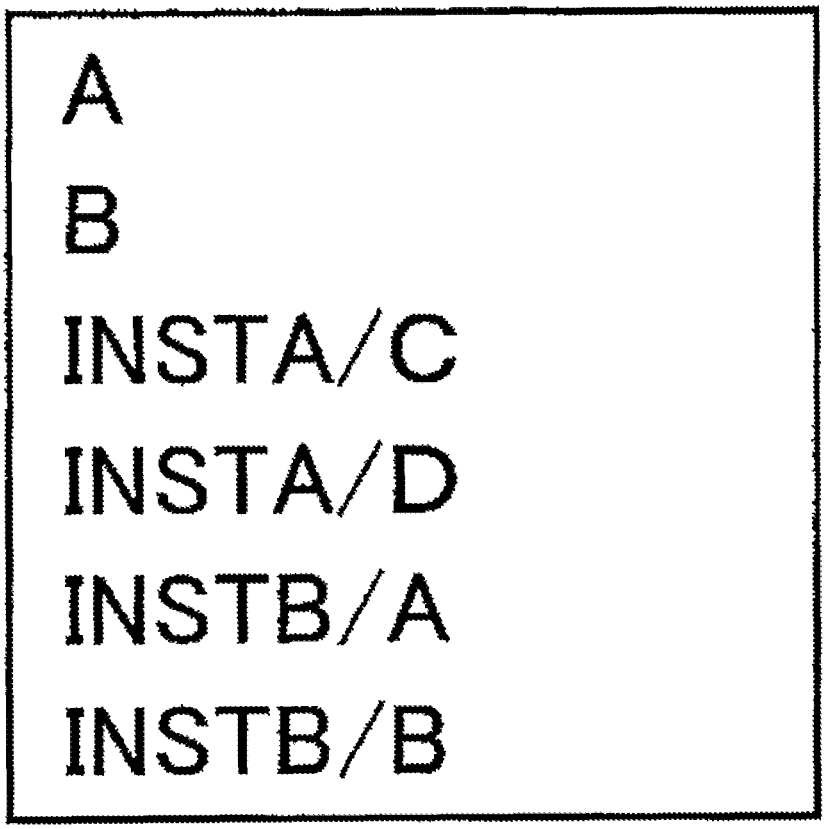
FIG. 2 is a signal list showing an example of signal information 104 of a first invention pertaining to the present application.

The signal information 104 is information storing a list of signals existing in the semiconductor device 100, as shown in FIG. 2, and signals of which logical values should be acquired in the present embodiment are described therein.

The circuit information 105 is information storing a logical structure and a relation of connection in the semiconductor device described in various hardware description languages (System C, SystemVerilog, Verilog-HDL, VHDL, EDIF(Electronic Design Interchange Format) or the like).

Figure 3:
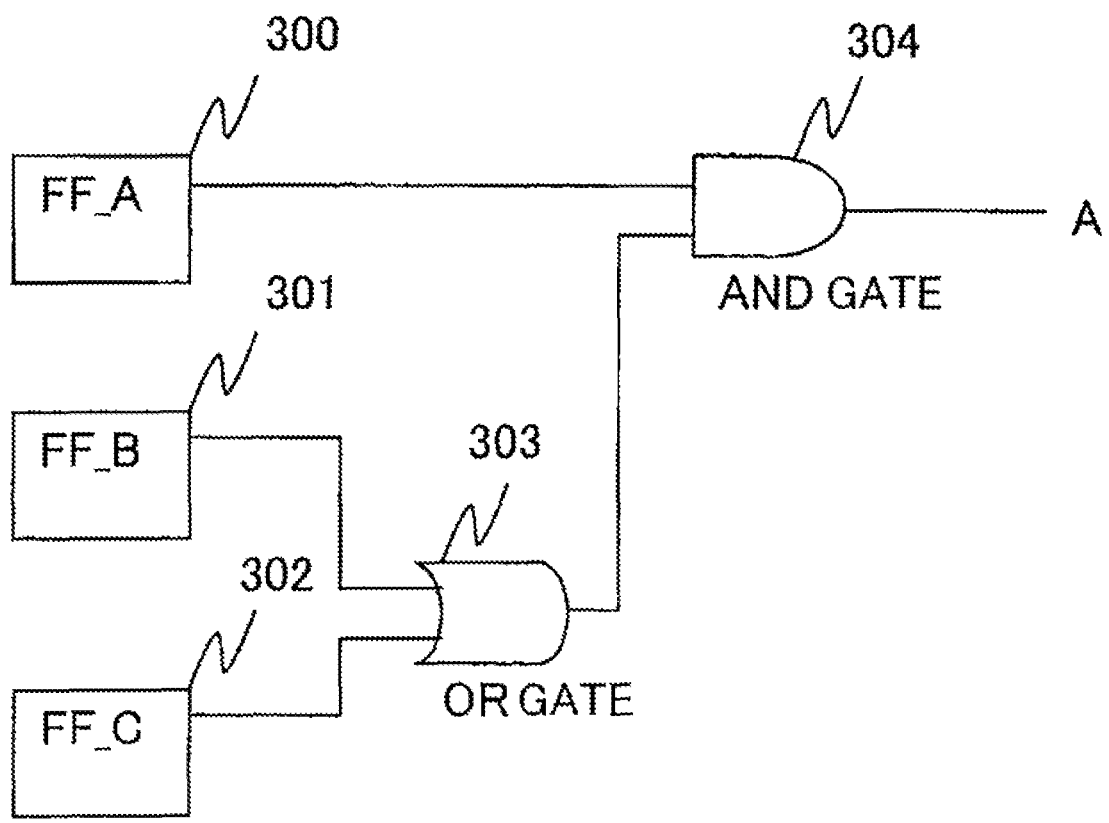
FIG. 3 is a circuit diagram showing a circuit configuration example to explain an operation of a first invention pertaining to the present application.

The memory element calculation function 107 calculates logical information for determining logical values of each of signals (for example, A, B, INSTA/C, INSTA/D, INSTB/A, INSTB/B in FIG. 2) described in the signal information 104 based on information in the circuit information 105. The memory element calculation function 107 outputs it to the memory element information 106 as a logical formula of which logical variable numbers (that is, node at a distal end) are memory elements. For example, in a case that the signal A is expressed using flip-flops FF_A300, FF_B301, FF_C302, an OR gate 303 and an AND gate 304 as shown in FIG. 3, the memory element calculation function 107 outputs each of signals described in the signal information 104 and its logical formulae as shown in FIG. 4, for example.

The central control function 109 is intended to control the memory element calculation function 107, and the logical value calculation function 108 and the loading control unit 103, and to acquire the logical values of signals in the signal information 104 from the semiconductor device 100 from which only logical values of the memory elements can be loaded. An operation of the central control function 109 will be explained according to a flowchart described below.

The logical value calculation function 108 is a function to calculate logical values of signals stored in the signal information 104 from the memory element information 106 and logical values of the memory elements acquired by the central control function 109 via the loading control unit 103. In a case of FIG. 3 and FIG. 4, it calculates a logical value of signal A from the logical values of the flip-flops FF_A300, FF_B301, FF_C302 acquired by the loading control unit 103 and the logical formula "(FF_A) and (FF_B or FF_C)" relating to the signal A in FIG. 4. For example, it calculates as 1 in a case that FF_A is 1, FF_B is 0 and FF_C is 1, and calculates as 0 in a case that FF_A is 1, FF_B is 0 and FF_C is 0.

The loading control unit 103 is a unit to control the loading unit 101 existing inside of the semiconductor device 100 based on information relating to the memory elements provided from the central control function 109 (for example, name of the memory element, FF_A 300 in a case of FIG. 4) and the loading unit control information 102, and to acquire the logical values of the memory elements provided from the central control function 109.

The loading unit control information 102 shows a method for controlling the loading unit 101 in order to load the logical values of the memory elements, specifically, as shown in FIG. 6. An example shown in FIG. 6 is that first "device stop instruction" stops the operation of the semiconductor device 100, next "number instruction" provides information relating to the memory elements (for example, information such as numbers and names uniquely assigned for memory elements) to the loading unit 101, next "load instruction" acquires the logical values of the memory elements designated by the "number instruction" from the loading unit 101, and next "device start instruction" returns to a state in which the semiconductor device 100 is operatable and acquires the logical values of desired memory elements. Giving more specific example, for the FPGA of XILINX Inc., details of loading unit control information are described in Non-Patent document 1, Chapter 8, Table 8-5.

Figure 5:
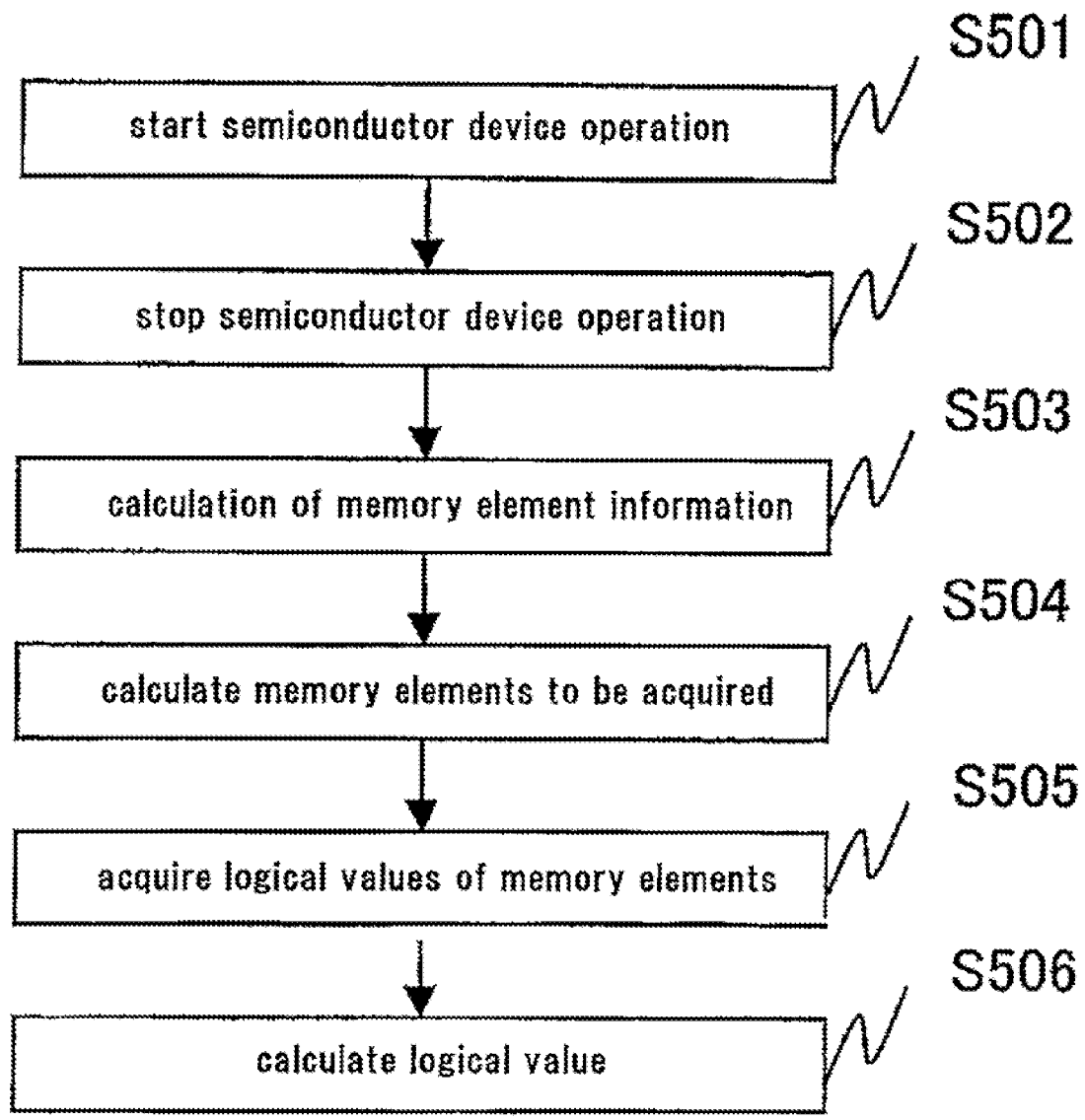
FIG. 5 is a flowchart showing an operation for carrying out a first invention pertaining to the present application.

Next, an entire operation of the present embodiment will be described with reference to FIG. 1 and a flowchart of FIG. 5.

In a step S501, the semiconductor device 100 starts operation. More specifically, in this step, a power is turn on so that the semiconductor device 100 can operate and, a configuration of FPGA is performed if the semiconductor device 100 is configured by the FPGA.

Next, in a step S502, the semiconductor device 100 temporary stops the operation. This is achieved by mainly stopping clock supply. Meanwhile, it only has to load the logical values of the memory elements of the semiconductor device 100, thus it may stop the power supply to the semiconductor device 100 if these logical values can be loaded.

Next, in a step S503, the central control function 109 makes the memory element calculation function 107 operate. The memory element calculation function 107 generates the memory element information 106 based on provided signal information 104 and circuit information 105. Meanwhile, this step may be performed before the step S501 or the step S502.

Next, in a step S504, the central control function 109 acquires information relating to all memory elements which are needed to acquire the logical values of all signals described in the signal information 104 from the memory element information 106. For example, in a case of FIG. 4, it is calculated that the logical values of the flip-flops FF_A300, FF_B301, FF_C302 is needed to calculate the logical value of the signal A.

Next, in a step S505, the central control function 109 controls the loading control unit 103 and acquires the values as to all memory elements acquired in the step S504 by making the loading control unit 103 operate. For example, in a case of FIG. 4, the loading control unit 103 acquires the values of the flip-flops FF_A300, FF_B301, FF_C302.

Next, in a step S506, the central control function 109 transfers the logical values as to all memory elements acquired by the loading control unit 103 to the logical value calculation function 108. The logical value calculation function 108 calculates the logical values of all signals described in the signal information 104 based on these logical values of signals and the logical information described in the memory element information 106.

Next, advantages of the present embodiment will be described. The present embodiment has an advantage that semiconductor devices which can load logical values of the memory elements only can be rendered possible to calculate the logical values of all signals inside the semiconductor devices by using the circuit information. Further, according to the present embodiment, only memory elements necessary for calculating logical values of desired signals are loaded from the semiconductor devices, and thus, it has an advantage that the amount of time taken for acquiring logical values of the signals can be reduced.

Next, an embodiment for carrying out the second invention of the present invention will be described in details.

Figure 7:
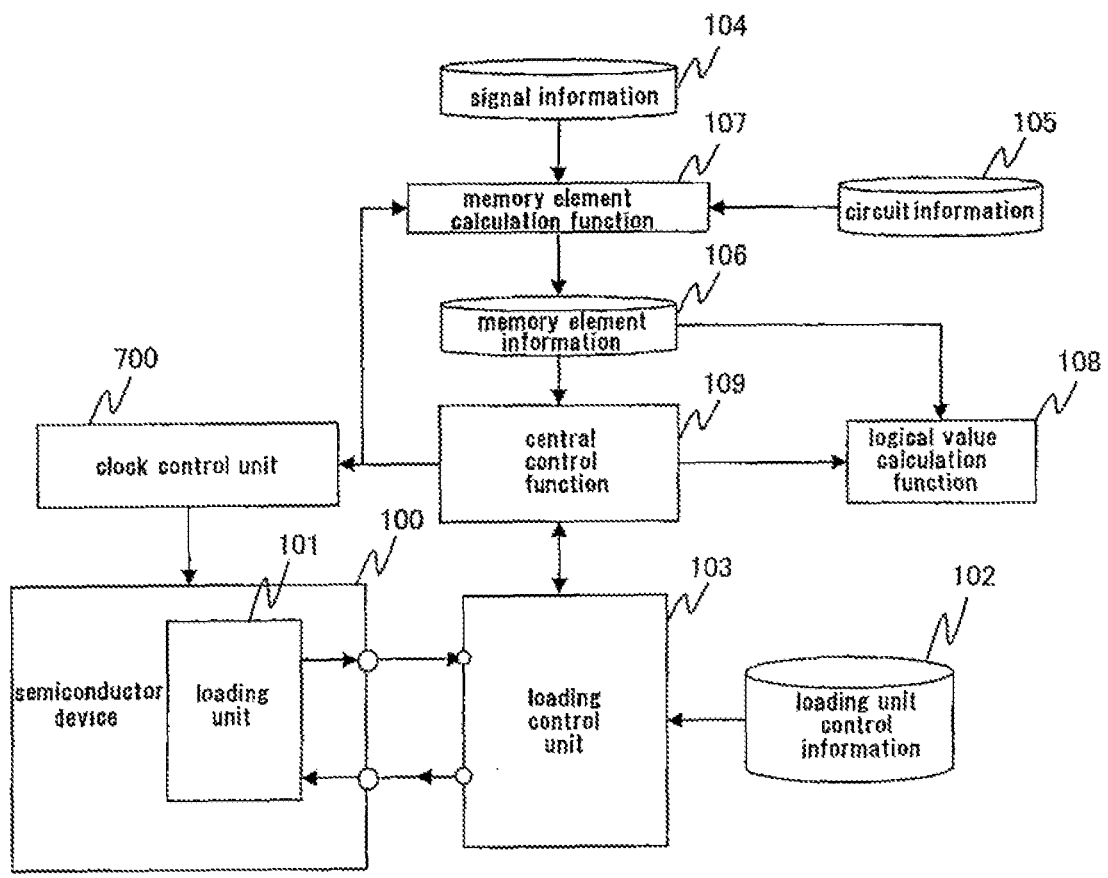
FIG. 7 is a block diagram showing a constitution for carrying out a second invention pertaining to the present application.

The second embodiment is that a clock control unit 700 is added to the preferred embodiment. The second embodiment will be described in details with reference to FIG. 7 below.

The clock control unit 700 is a unit which supplies clock signals to the semiconductor device 100 and stops the supply in accordance with instructions from the central control function 109. Here, by having a function for stopping the clock supply based on a value of an output terminal of the semiconductor device 100 (break setting function), or a function for supplying clocks equal to the designated number, it is possible to control signals which are monitored by one clock cycle, and to stop the operation of the semiconductor device 100 at the desired time to monitor. Thus, it is possible to provide better semiconductor verification apparatus. Further, if circuits such as CPU and DSP operated by software are implemented in the semiconductor device 100, it is possible to provide better semiconductor verification apparatus by controlling the clock supply and the clock supply stopping using a program counter thereof, detecting loading and writing to a specific address of the memory in the semiconductor device 100 to control the clock supply and the clock supply stopping, and enabling to designate the number of reaching a breakpoint. For example, as conditions for clock supply stopping of the clock control unit 700, there are (1) a case that the logical value of a signal becomes a specific value, (2) a case that the logical value of a signal becomes within a specific range or outside the range, (3) a case of occurring the case (1) or (2) designated number of times, (4) a case of occurring a break in an apparatus operating by a software such as one or more of internal CPU and DSP and the like, and (5) a case of combining cases described above. Configuring one or more of these functions so that the clock can be stopped in a various conditions allows to provide better semiconductor verification apparatus. Moreover, in a case of hardware emulator, since it is possible to change a circuit of operating object itself, it is possible to use all signals of the semiconductor device 100 as a break condition (a condition for stopping the clock supply). Thereby, it becomes possible to perform control more precise than the case of the hardware emulator.

Figure 8:
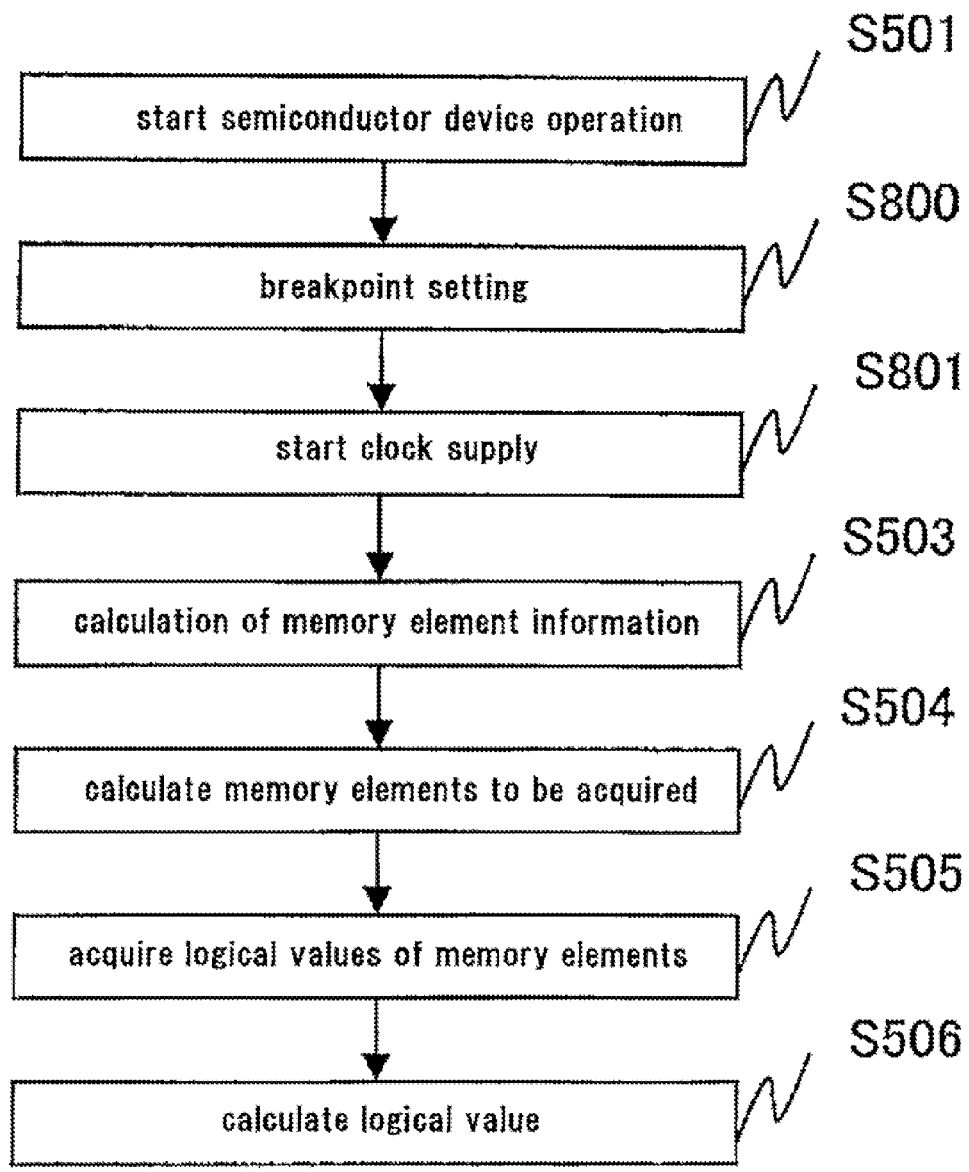
FIG. 8 is a flowchart showing an operation for carrying out a second invention pertaining to the present application.

Next, an entire operation of the present embodiment will be described with reference to a flowchart of FIG. 8.

The present embodiment is that the step S502 of the flowchart in the preferred embodiment is replaced to a step S800 and a step S801. The steps S800 and S801 which are added will be described in details below.

The step S800 is that a break point setting is performed. In this step, it is set to the clock control unit 700 by a user that the number of clock cycles for stopping the clock, or stopping the clock supply when logical value of the signal in the semiconductor device 100 becomes a specific logical value, or the like. However, setting content may have several variations according to functions of the clock control unit 700.

The step S801 is that the clock control unit 700 starts the clock supply. Thereby, the semiconductor device 100 stars the operation. In this step, the clock supply is stepped when arriving the break point set in the step S800, then the operation of the semiconductor device 100 is stopped. If all clocks are stopped, there is a case that the semiconductor device 100 cannot normally restart the operation (for example, a circuit for refreshing DRAM and a circuit for data transmission and reception with outside), therefore the clocks may be stopped partially. Here, it requires to completely stop the clock signal relating to desired signal.

Next, advantage of the present embodiment will be described.

The present embodiment has an advantage that the logical value of the desired signal can be monitored to an accuracy of clock unit by adding the clock control unit 700.

Next, an embodiment for carrying out the third invention of the present invention will be described in details.

The embodiment for the third invention is that an acquisition order calculation function 900 is added to the preferred embodiment, and the operations of the central control function 109 and the logical value calculation function 108 are changed.

Figure 10:
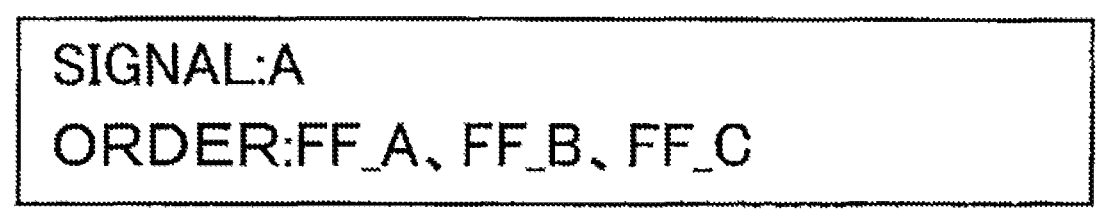

The acquisition order calculation function 900 is a function for inputting the data of the memory element information 106 (for example, FIG. 4), determining an acquisition order of the memory elements for each signal, and outputting the information relating to the order (for example, FIG. 10). The central control function 109 (the loading control unit 103 in actual operation) loads the logical values of the memory elements from the semiconductor device 100 in accordance with this order. For example, FIG. 10 defines to acquire the logical values in order of FF_A, FF_B and FF_C for the signal A.

As a first method for determining the loading order, the acquisition order calculation function 900 defines the order so as to be in ascending order of the number of logic stages between the appropriate signal and each memory element.

As a second method for determining the loading order, the acquisition order calculation function 900 makes up an equivalent circuit using three circuits of a two input AND, a two input OR and NOT, in which logical variable numbers are memory elements, and defines the order so as to be in ascending order of the number of logic stages between the appropriate signal and each memory element. For example, in the circuit of FIG. 3, the number of logic stages between the signal A and memory elements FF_A 300, FF_B 301, FF_C 302 are 1, 2 and 2 respectively, thus it outputs the acquisition order information 901 so that the loading control unit 103 acquires FF_A first, next FF_B or FF_C. This is because the logical value of the signal line A may be defined only by the logical value of the memory element FF_A 300 in some cases of the logical value of the memory element FF_A 300, thus it is not needed to acquire FF_B 301, FF_C 302 and it is possible to speed up the whole operation. More specifically, if the logical value of FF_A 300 is 0, the logical value of the signal A becomes 0 in despite of the logical values of FF_B 301, FF_C 302, thus it is possible to omit the operation for acquiring the logical values of FF_B 301, FF_C 302 from the loading control unit 103 and it is possible to speed up the whole operation. It would appear that the above-described matter is subject to occur in the memory element having the small number of logic stages, thus outputting the order in ascending order of the number of logic stages between the appropriate signal and memory elements by the acquisition order calculation function 900 enables to speed up the whole operation.

As a third method for determining the loading order, the acquisition order calculation function 900 outputs the acquisition order information 901 so that it defines the order so as to be in ascending order of the number of each term in each logical formula, meanwhile the order in descending order of appearance ratio of the logical variable number in a case that the numbers of logical variable number are same. Explaining more specifically, in a case that minimum logical OR form of an arbitrary signal is A OR BC (A or (B and C)), it is not needed to acquire the values of B and c if the logical value of A is 1, and the logical value of this signal line becomes 1. Thus, by defining the order in ascending order of the number of logical variable number of each term, it is possible to speed up the whole operation. Further, in a case of FIG. 3, the minimum logical OR form is AB OR AC (here, A represents FF_A 300, B represents FF_B 301 and C represents FF_C 302), the numbers of logical variable number of each term are same. In the case that the numbers of logical variable number are same, it makes the operation of the acquisition order calculation function 900 in descending order of appearance ratio of the logical variable number so that the logical variable number A (the memory element FF_A) is acquired first, thus it is possible to speed up the whole operation. Moreover, it is similar in the minimum logical AND form. In a case that the minimum logical AND form is A (B OR C) (A and (B or C)), it is not needed to acquire the values of B and C if the logical value of A is 0, and the logical value of this signal becomes 0. Thus, the acquisition order calculation function 900 defines the order so as to be in ascending order of the number of logical variable number of each term, this enables to speedup the whole operation.

As a fourth method for determining the loading order, it defines the order so as to be in order of memory elements having the highest influence degree for a desired signal. As a specific example of the influence degree, there is a method in which it is defined as the number of the logical variable number which can be deleted when the logical value of a memory element is loaded (when the logical value is determined). For example, in a case that the minimum logical OR form is "ABC OR BD OR E", the BC in the "ABC" can be deleted when the memory element A is 0 (that is, it is not needed to acquire the values of the memory elements B and C in so far as the term "ABC"), no one can be deleted when it is 1, thus the influence degree is defined as 2+0=2. In this way, it obtains the influence degrees for all memory elements. In this example, the influence degrees for each of the memory elements are 3 for the memory element B, 2 for the memory element C, 1 for the memory element D, and 4 for the memory element E. Hence, it defines the loading order E, B, E, C, D or E, B, C, A, D.

The logical value calculation function 108 changes the operation so that it tries to calculate the logical value even if all of the logical values of logical variable numbers (memory elements) do not exist. In the preferred embodiment, since all of the logical values of logical variable numbers are defined before calculation, the logical value of signal has become 0 or 1. On the other hand, in the present embodiment, it is added a function for notifying the central control function 109 of a state in which the logical value cannot be calculated only by the current logical values of memory elements. Upon receiving this information, the central control function 109 operates so that it further acquires the logical value of the logical variable number based on the acquisition order information 901.

Figure 11:
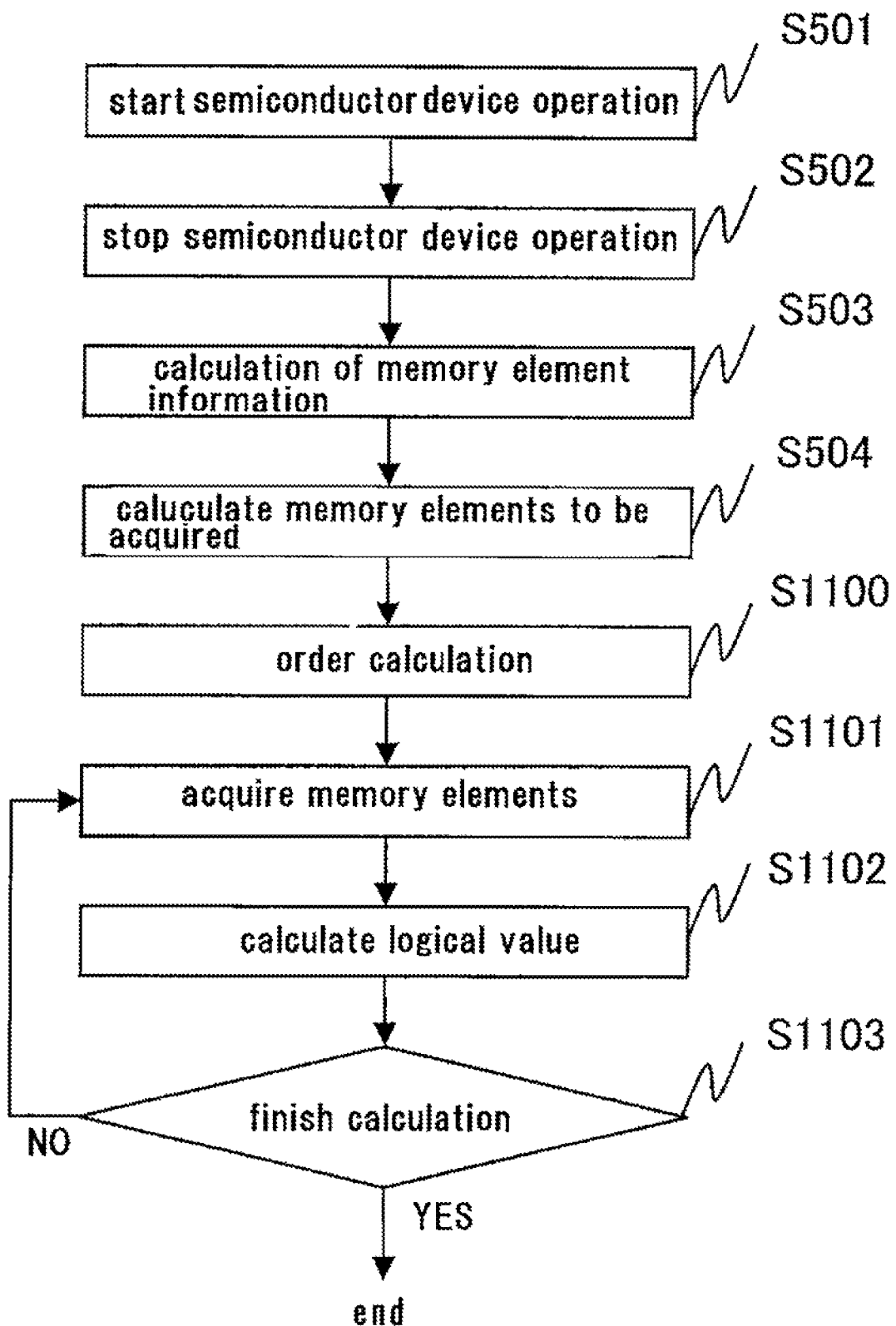
FIG. 11 is a flowchart showing an operation for carrying out a third invention pertaining to the present application.

Next, an entire operation of the present embodiment will be described with reference to a flowchart of FIG. 11.

The operation of the present embodiment is that the steps S505 and S506 of the operation in the preferred embodiment (FIG. 5) are changed to the steps S1100 to S1103. The steps S1100 to S1103 will be described in details below.

The step S1100 is that the acquisition order calculation function 900 stars the operation and outputs the acquisition order information 901 based on the memory element information 106.

In the step S1101, the central control function 109 acquires, via the loading control unit 103, the logical value of one memory element which has the highest priority among the memory elements of which the logical values have not been acquired yet, with reference to the acquisition order information 901. For example, in a case that the acquisition order information 901 is as shown in FIG. 10, the logical value of the memory element FF_A has been acquired, and the logical values of the memory elements FF_B and FF_C have not been acquired yet, it acquire the logical value of the memory element FF_B which has the highest priority via the loading control unit 103.

In the step S1102, the logical value calculation function 108 tries to calculate the logical value using all of logical values of the memory elements which are acquired in the former operation.

In the step S1103, it is determined whether or not the logical value calculation function 108 could calculate the logical value. It returns to the step S1101 if the logical value could not be calculated, it finishes the operation if the logical value could be calculated since the purpose has been achieved. For example, as to signal A in FIG. 4, in a case that the memory elements FF_A is 1 and FF_B is 0 in the former operation, the logical value of the signal A cannot be determined if the value of the memory element FF_C is not acquired. Thus, the logical value calculation function 108 cannot calculate the logical value. Therefore, it returns to the step S1101, and operates so as to acquire the logical value of the memory element (FF_C) which has the highest priority among the memory elements of which the logical values have not been acquired yet in a series of the former operation. On the other hand, in a case that the memory elements FF_A is 1 and FF_B is 1 in the former operation, the logical value of the signal A can be determined as 1. Thus, the logical value calculation function 108 outputs the logical value 1 and finishes the operation.

Next, advantages of the present embodiment will be described.

According to the present embodiment, since the logical values of the memory elements are acquired one by one and it determines whether the logical value can be calculated with each acquisition, it is possible to speed up the operation in a case that the logical value of the target signal can be determined even if all of the logical values of the memory elements are not acquired. Moreover, in order to determine the logical value by the memory elements as low as possible, it devises a way in which the acquisition order calculation function 900, for example, makes up an equivalent circuit using three circuits of a two input AND, a two input OR and NOT, in which logical variable numbers are memory elements for each signal, and acquires it in ascending order of the number of logic stages between the signal and memory elements. As another way, it devises a way in which the logical formula of the signal is transformed to the minimum logical AND form or the minimum logical OR form, and it determines the order so as to be in ascending order of the number of logical variable number of each term, and the order so as to in descending order of appearance ratio of the logical variable number in a case that the numbers of logical variable number are same. These enable to speed up the operation.

Next, a fourth embodiment will be described.

Figure 9:
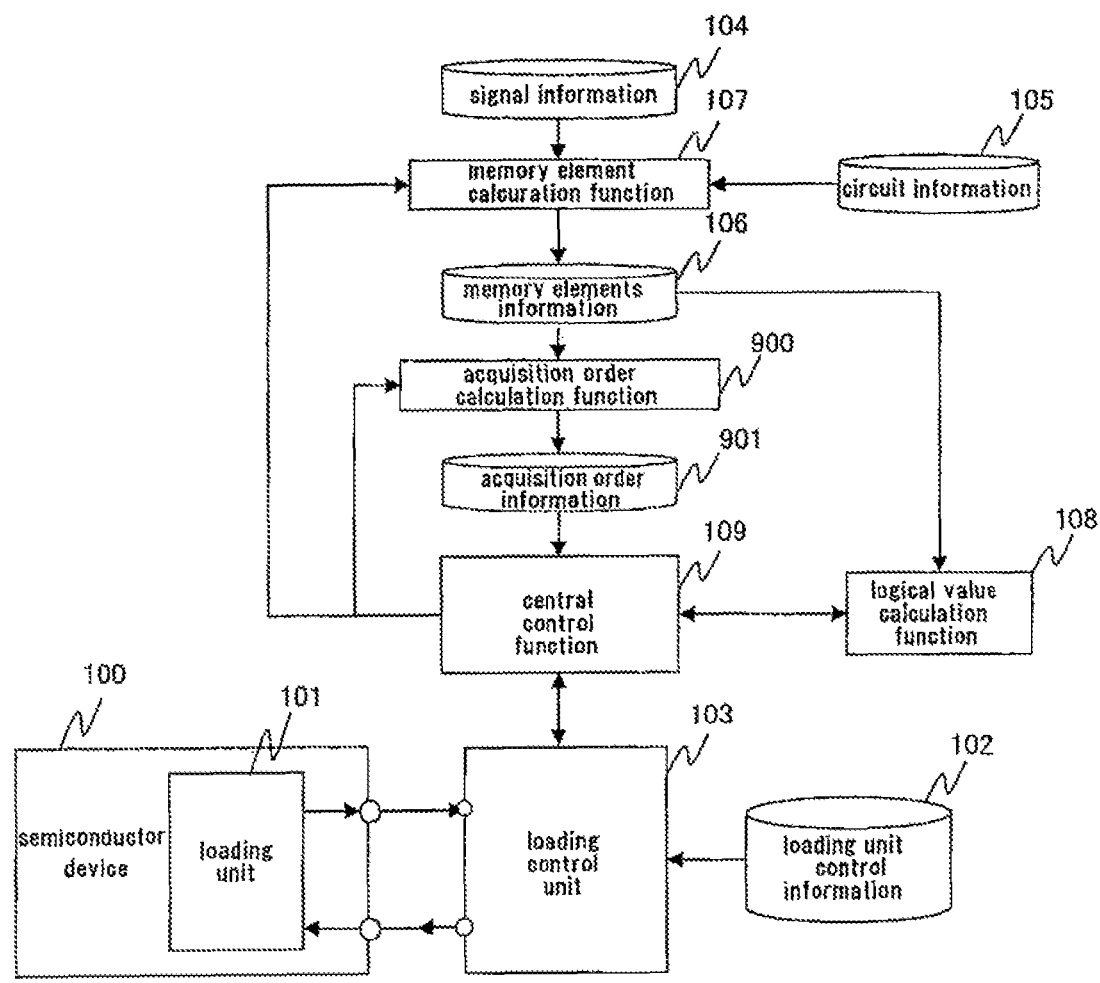
FIG. 9 is a block diagram showing a constitution for carrying out a third invention pertaining to the present application.

The fourth embodiment causes the acquisition order of the memory elements to change dynamically in the third embodiment. The constitution thereof is same as that of the third embodiment (FIG. 9). The acquisition order calculation function 900 and the central control function 109 are changed from the third embodiment.

The acquisition order calculation function 900 is different from that in the third embodiment, changes the operation so that it does not determine all order before starting the load operation and it determines only one memory element to be loaded during one loop which is from the step S1101 to the step S1103.

The acquisition order calculation function 900 calculates only one memory element to be loaded during one loop which is from the step S1101 to the step S1103. The method for determining the order may be same as that in the third embodiment.

With respect to the operation of the central control function 109, it will be explained using a flowchart of FIG. 12.

Figure 12:
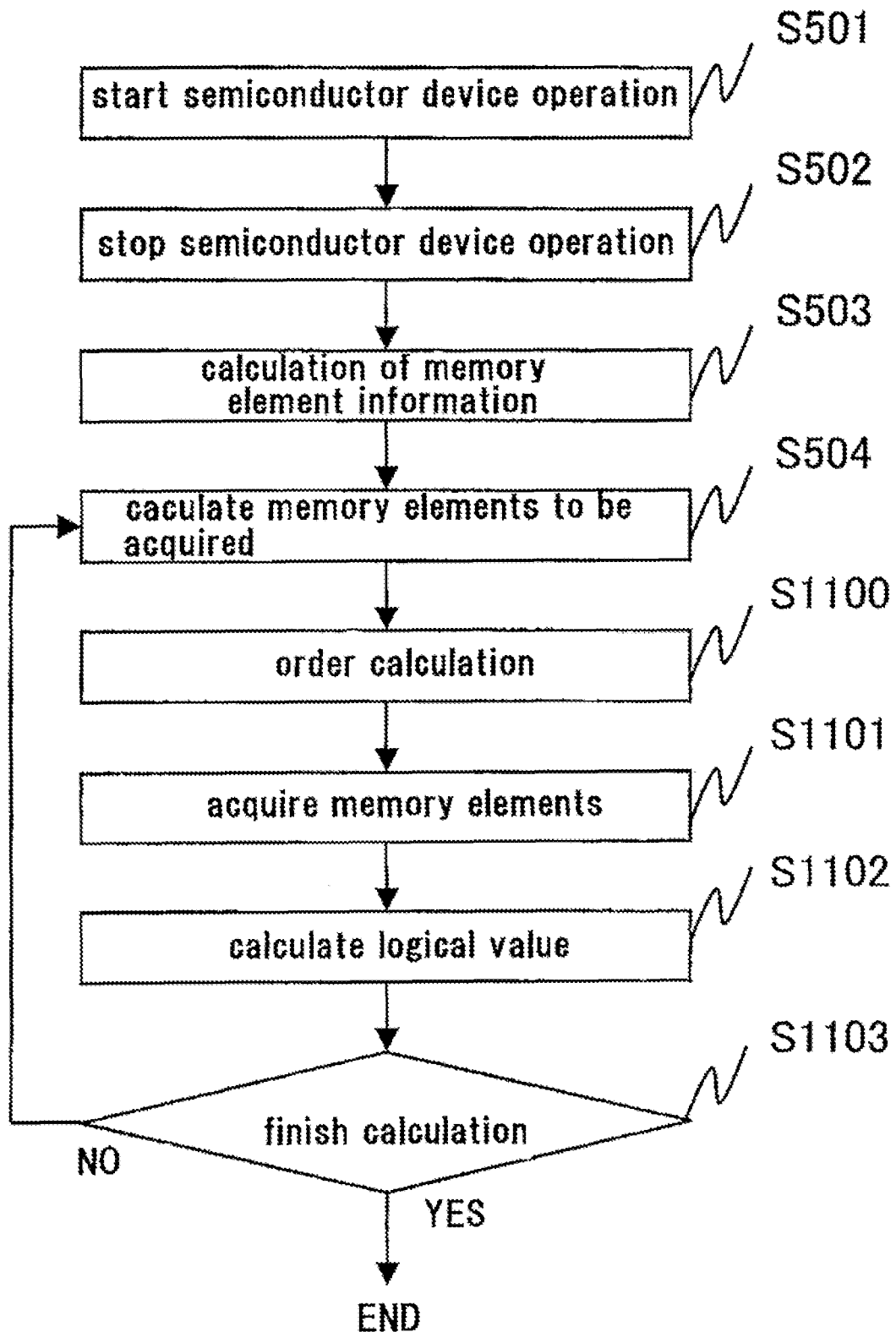
FIG. 12 is a flowchart showing an operation for carrying out a fourth invention pertaining to the present application.

Referring to FIG. 12, the only change from the third embodiment is that a destination in a case of "no" in the step S1103 is not the step S1101 and changes to the step S504.

Next, advantages of the present embodiment will be described.

According to the present embodiment, it causes the acquisition order of the memory elements to change dynamically from the third embodiment. For example, according to the fourth method for determining the loading order, if all order is determined before acquiring the memory elements as the third embodiment, acquisition order of the memory elements is determined as the memory elements E, B, A, C, D (it is possible to reverse A and C), considering the influence degrees thereof. However, for example, it assumes that the loop from the step S504 to the step S1103 has been executed twice (two memory elements have been acquired), and then the logical value of the memory element E is 0 and the logical value of the memory element B is 1. In this case, the minimum logical OR form becomes "AC OR D". Here, newly calculating the influence degrees, A and C become 1 and D becomes 2. Thus, the memory element D is acquired in first, and there is a case that the operation is different from that of the third embodiment. The operation comes into complex by doing so but, it is possible to increase a possibility for speeding up the operation.

Figure 13:
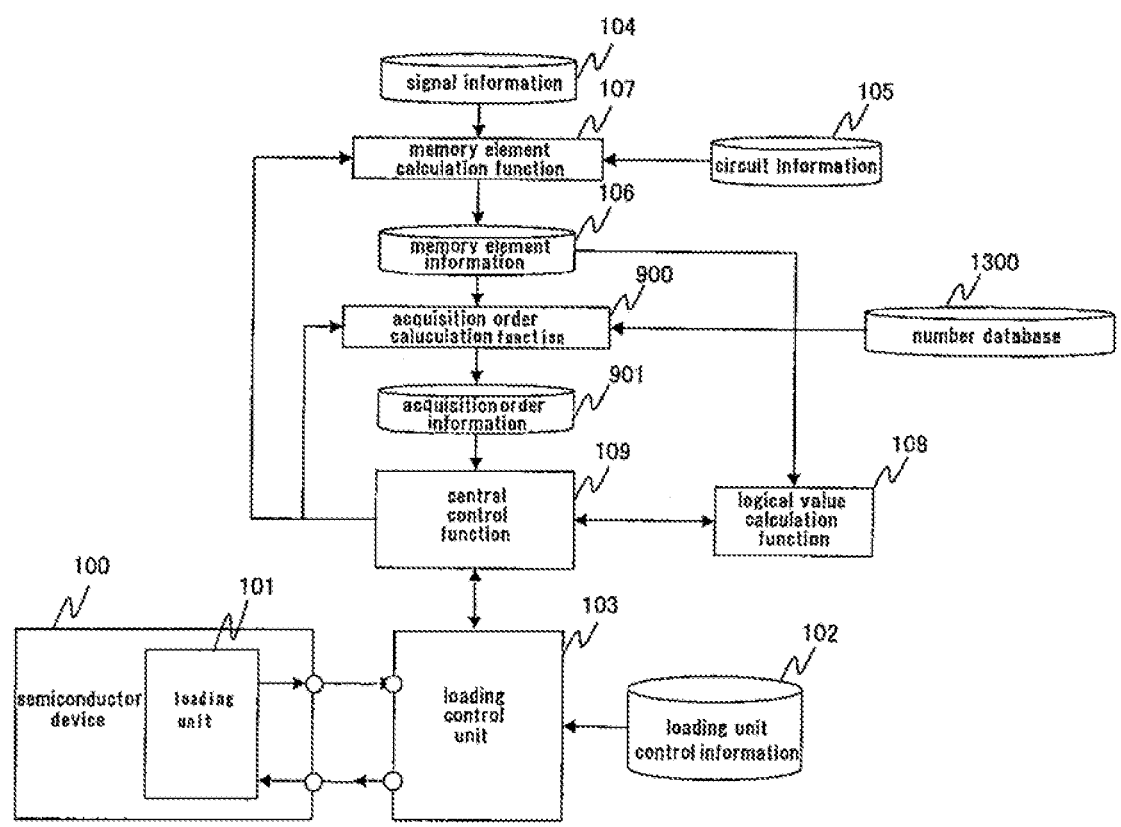
FIG. 13 is a block diagram showing a constitution for carrying out a fifth invention pertaining to the present application.

Next, a fifth embodiment will be described in details with reference to FIG. 13.

The fifth embodiment relates to a case in which the memory elements of the semiconductor device 100 are uniquely distinguishable by a combination of a first number and a second number, and the loading unit 101 performs an access based on the first number and the loading unit control information 102, thereby it is possible to load all of the logical values of the memory elements corresponding to the first number. In the present embodiment, only the number database 1300 is added and the calculation method of the acquisition order calculation function 900 is changed from the fourth embodiment.

Here, the first numbers and the second numbers will be specifically explained.

The first numbers and the second numbers are the numbers assigned to a plurality of the memory elements existing inside of the semiconductor device 100. The combination of the first number and the second number, and each of the memory elements correspond one-on-one. Controlling the loading unit 101 based on the first number and the loading unit control information 102 causes the loading unit 101 to output the logical value of the memory element corresponding to the first number. For example, in a case that the numbers such as in FIG. 16 are assigned to each of memory elements, by controlling the loading unit 101 based on the number 0x1024 and the loading unit control information 102, the logical values of the memory elements A and D are output from the loading unit 101. A specific example thereof is FPGA of XILINX Inc. Here, the first numbers and the second numbers of XILINX Inc. are described in Logic Location File (Chapter 8, FIG. 8-8 in non-patent document 1), the file describes the name of memory elements inside of the semiconductor device 100 and the first numbers (Frame Address) and the second numbers (Frame Offset). FIG. 14 is a extracted part of the Logic Location File in which the third column shows the first numbers (Frame Address), the fourth column shows the second numbers (Frame Offset), and the seventh column shows the name of memory elements. In the present embodiment, the number database 1300 includes information for associating the name of memory elements, the first number and the second number.

In the present embodiment, since the logical values of the memory elements having same first number can be acquired by one operation of the loading control unit 103, the influence degrees of the memory elements having same first number are added to determine the memory elements to be acquired. For example, in a case that the minimum logical OR form of arbitrary signal is "ABC OR BD OR E", the influence degrees of each of the memory elements are 2 for memory element A, 3 for memory element B, 2 for memory element C, 1 for memory element D and, 4 for memory element E but, it causes to operate so as to acquire the memory elements A, C and D in first if the memory elements A, C and D have the same first number and B and E have other first number.

As a matter of course, in the preset embodiment, the acquisition order calculation function 900 of the third embodiment can apply to the acquisition order calculation function 900.

The number database 1300 is data stored combinations of the name of all signals existing in the semiconductor device 100 and the first numbers. The acquisition order calculation function 900 uses the number database 1300 to acquire the first number from the name of memory element.

Next, advantages of the present embodiment will be described.

In the present embodiment, the memory elements of the semiconductor device 100 are distinguishable by a combination to the first number and the second number, and it is possible to operate in higher speed as to the loading unit 101 which can load all of the logical values of the memory elements corresponding to the first number by performing an access based on the first number and the loading unit control information 102. The FPGA of XILINX Inc. may be taken as an example for one of such aspect.

Figure 15:
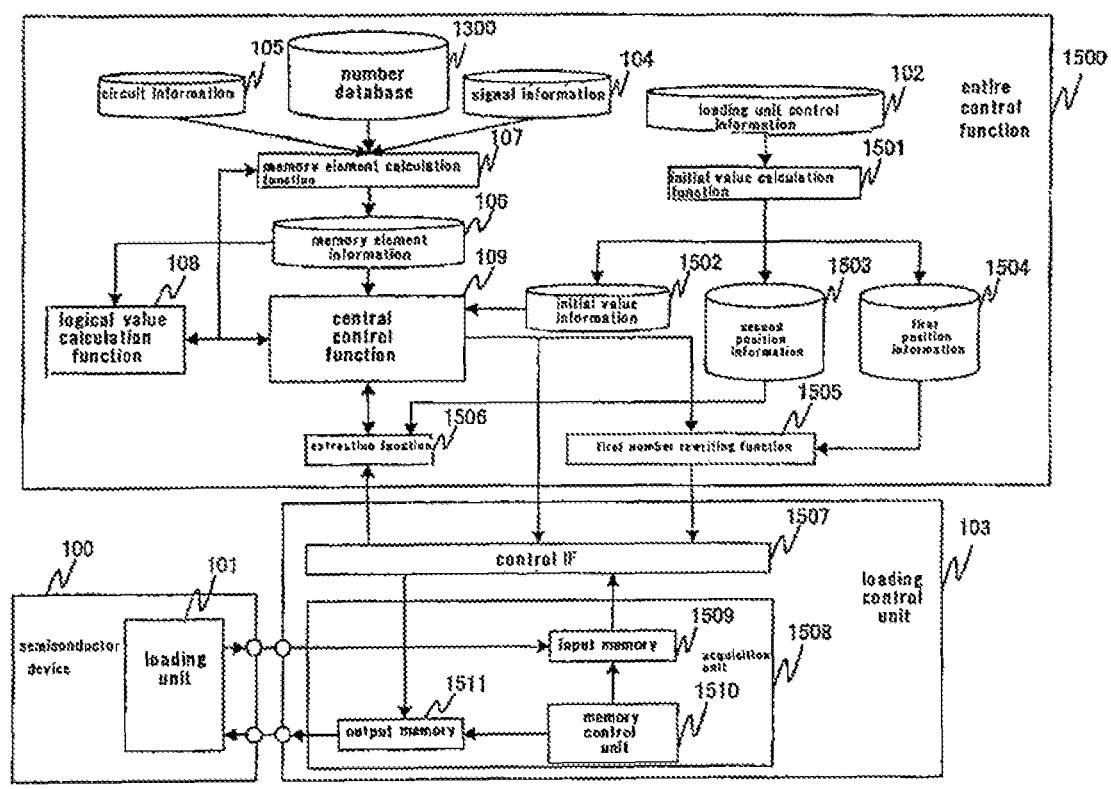
FIG. 15 is a block diagram showing a constitution for carrying out a sixth invention pertaining to the present application.

Next, a sixth embodiment will be described in details with reference to FIG. 15.

The sixth embodiment relates to a case, as in the fifth embodiment, in which the memory elements of the semiconductor device 100 are uniquely distinguishable by a combination of the first number and the second number, and it performs an access based on the first number and the loading unit control information 102, thereby it is possible to load all of the logical values of the memory elements corresponding to the first number. Further, the present embodiment intends to make the loading control unit 103 to operate in higher speed.

The sixth embodiment generally comprises an entire control function 1500, the loading control unit 103 and the semiconductor device 100.

Further, the loading control unit 103 includes:

an acquisition unit 1508 which controls the loading unit 101; and a control IF 1507 which acquires a content of an input memory 1509, rewrites a content of an output memory 1511 and transfers an instruction from the entire control function 1500 to a memory control unit 1510.

Further, the acquisition unit 1508 includes:

the input memory 1509 which is directly connected to an output terminal of the loading unit 101 and records the values of the output terminal for each of clock cycles;

the output memory 1511 which is directly connected to an input terminal of the loading unit 101, and in which values for each of clock cycles (this is initial value information 1502 as described below) to be provided to the input terminal are stored; and the memory control unit 1510 which controls an address terminal, an enable terminal and a write enable terminal of the input memory 1509 to perform a control in which the value of the output terminal of the loading unit 101 is recorded into the input memory 1509, further controls an address terminal and an enable terminal of the output memory 1511 to appropriately provide the value of the output memory 1511 to the loading unit 101.

The operation of the memory control unit 1510 will be described in details with reference to FIG. 17 and FIG. 18.

Figure 18:
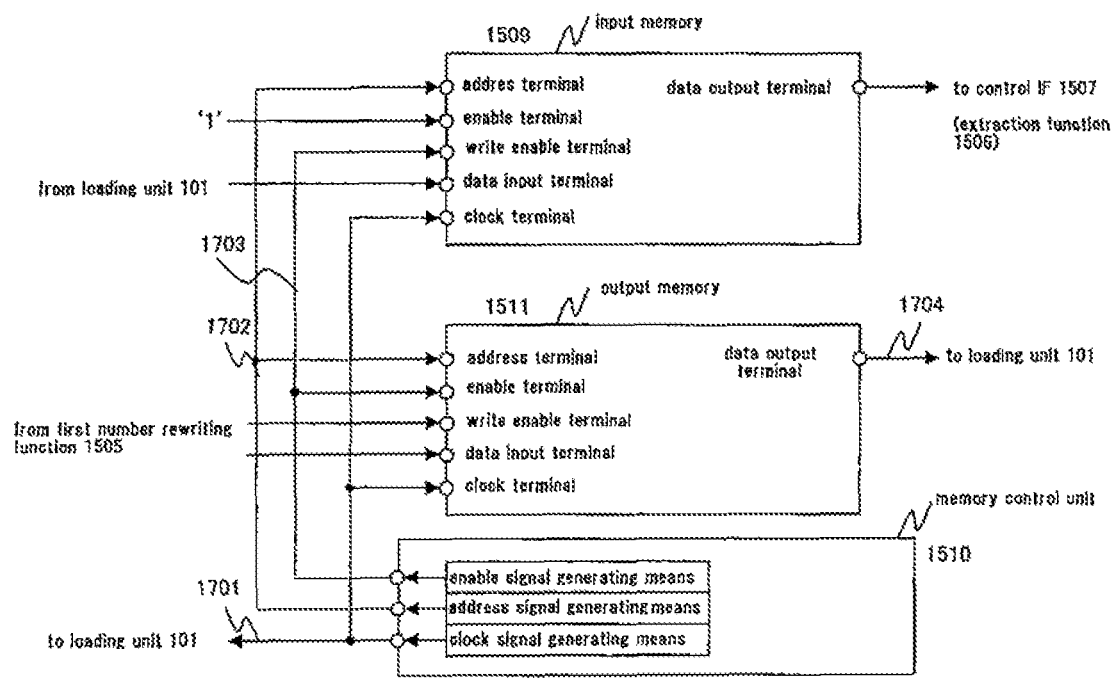
FIG. 18 is a block diagram showing a control example of an output memory 1511 and an input memory 1509 of a memory control unit 1510, for explaining a sixth invention pertaining to the present application.

FIG. 18 is an example of the acquisition unit 1508 illustrated more specifically. In this example of circuit, it is omitted a control of the address terminal and the enable terminal when writing by the initial value information 1502 and rewriting the content of the output memory 1511 by a first number rewriting function 1505, and a control of the address terminal when the extraction function 1506 loads the value. However, it is easy to achieve them if the memory control unit 1510 processes appropriately in such cases.

Figure 17:
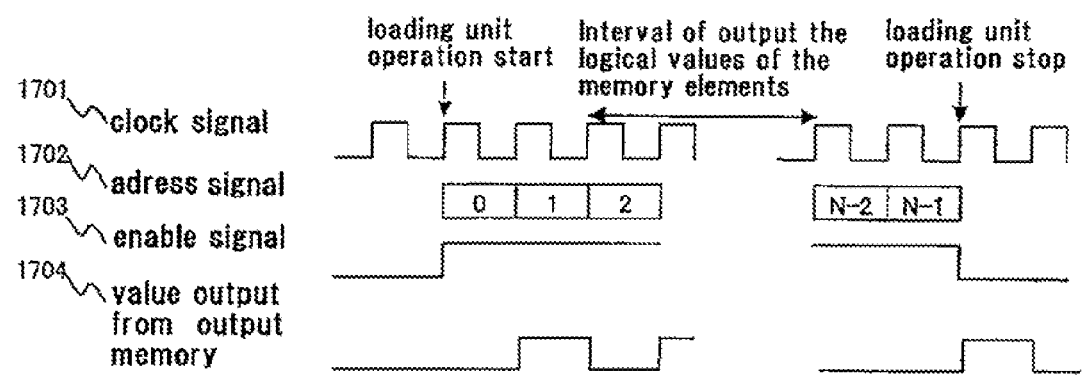
FIG. 17 is a timing chart showing an example of signal transmission and reception between an acquisition unit 1508 and a loading unit 101 for explaining a sixth invention pertaining to the present application.

In FIG. 18, the memory control unit 1510 controls the address terminal and the write enable terminal of the input memory 1509, further controls the address terminal and the enable terminal of the output memory 1511 as shown in FIG. 17. In FIG. 17, the clock signal 1701 is a signal provided to the loading unit 101, the input memory 1509 and the output memory 1511, and needed for synchronized operation of all of these units. Moreover, the address signal 1702 is the address signal provided to the address terminals of the input memory 1509 and the output memory 1511. Although the same signal is used for the signal provided to the address terminal of the input memory 1509 and to the address terminal of the output memory 1511 in this example, other aspect may be applied in so far as the operation speed does not decrease when the signals are separated. The enable signal 1703 is in common with a signal provided to the enable terminal of the output memory 1511 and a signal provided to the write enable terminal of the input memory 1509. Also, for this signal, an aspect in which individual signals are provided may be applied in so far as the operation speed does not decrease. The numeral reference 1704 described in FIG. 17 shows an example of value which is output from the output terminal of the output memory 1511. Providing this signal to the loading unit 101 causes the loading unit 101 to operate based on the first number included in this signal and to output the logical values of the memory elements existing inside of the semiconductor device.

Although, in this example, the memory control unit 1510 provides the clock signal 1701 to the input memory 1509, the output memory 1511 and the loading unit 101, it is only one example, and it may be applied an aspect of being provided from outside and an aspect in which data does not provided to the loading unit 101 every clock cycle and one data item is provided within a plurality of clock cycles. Moreover, although, in this example, the data is provided to the loading unit 101 from a lower level of address by incrementing the address, on the contrary, it may be loaded from a higher level sequentially and it may be applied an address generation method if it causes the operation to speed up than the increment. Further, although the waveform diagram is illustrated by positive logic in this example, it may have a signal which is operated by negative logic in a circuit.

Thus, by configuring the memory control unit 1510 simply, it is possible to make the operation to speed up and to achieve a high speed extraction operation, when the acquisition unit 1508 is implemented by the FPGA of which the operation is slow. Moreover, if there are a plurality of input terminals and output terminals in the loading unit 101, it may prepare the input memory and the output memory for each terminal. By configuring such constitution, the bit width of the memory and the bit width of the loading unit 101 correspond inevitably, thus it is possible to reduce a waste of the memory. Further, since it can omit a circuit for transforming a bit position or the like, it is possible to operate the loading unit 101 and the acquisition unit 1508 at high speed and to acquire logical values of desired memory elements in short time period. Moreover, it is possible to achieve a similar matter by using a memory which has a bit width same as or wider than that of the terminal and fixing the bit position of the memory which corresponds to the terminal.

The entire control function 1500 includes:

the memory element information 106 which stores the first numbers and the second numbers of each memory element in addition to the information in FIG. 4 of the preferred embodiment;

an initial value calculation function 1501 which calculates, based on the loading unit control information 102, initial value information 1502 which is a value of the output memory 1511, first position information 1504 in which a position of the first number in the output memory 1511 are stored, second position information 1503 which indicates positions where the logical values of the memory elements having the second numbers are stored for each second number (if the second numbers are same, it is assumed that the stored positions in the input memory 1509 are same);

the first number rewriting function 1505 which rewrites the first number stored in the memory element information 106 only part corresponding to the output memory 1511 based on the first position information 1504;

the extraction function 1506 which acquires only part corresponding to the second number of the input memory 1509 from the input memory 1509 based on the second position information 1503;

the memory element calculation function 107 which calculates memory elements and logical structure determining logical values of the signals from circuit information 105 for each signal stored in signal information 104, and outputs these information and the first number and the second number of the corresponding memory elements as memory element information 106;

the central control function 109 which controls operations of the loading control unit 103, the memory element calculation function 107, the logical value calculation function 108, the first number rewriting function 1505 and the extraction function 1506; and logical value calculation function 108 which calculates logical values of individual signals stored in the signal information 104, from information stored in the memory element information 106 and logical values of individual memory elements acquired by the central control function 109 via the loading control unit 103.

The memory element calculation function 107 outputs the desired signals which are described in FIG. 4 and are output data of the preferred embodiment, the first number and the second number relating to each memory element such as in FIG. 19 other than its logic, using the number database 1300. In FIG. 19, for example, it assumes that the first number of FF_A is 0x1024 and the second number thereof is 0x1.

Here, it will be explained more specifically, with respect to the initial value calculation function 1501, the initial value information 1502, the first position information 1504, the second position information 1503, the first number rewriting function 1505 and the extraction function 1506.

The initial value calculation function 1501 calculates, based on the loading unit control information 102 and a connection configuration of devices (JTAG or the like), the initial value information 1502 which is content of the output memory 1511, the first position information 1504 which indicates a bit position of the first number in the output memory 1511, and the second position information 1503 which indicates position information of each second number in the input memory 1509. For example, when the first number of FIG. 6 is 32 bit and each instruction is 12 bit (the number instruction has 12 bit for instruction and 32 bit for the first number, 44 bit for total) and it assumes that bit patterns of each of the instructions are that in FIG. 6, then 0x300_005_XXXXXXXX_001_301 (X is first number which is rewritten in each operation, therefore arbitrary value can be used here. Further it assumes MSB First as data input direction) is stored in the initial value information 1502 (initial value of the output memory 1511), and $24^{th}$ bit for starting position and $56^{th}$ bit for end position are stored in the first position information 1504. Further, the initial value calculation function 1501 calculates, based on the loading unit control information 102 and a configuration of the input memory 1509 or the memory control unit 1510, the second position information 1503 which is a list of addresses according to which the logical values of the memory elements are written. The addresses shows that the logical values of the memory elements are written at the address 0x3 in the input memory in a case that the second number is 0, and at the address 0x4 therein in a case that the second number is 1. If the semiconductor device 100 is connected by JTAG, it requires to control two signals of TDI and TMS, and to provide appropriate value to the loading unit 101 at appropriate state. Further, the calculation methods are different according to the connection configuration of the devices. Thus, the calculation of the initial value information 1502, the first position information 1504 and the second position information 1503 is complicated. For this reason, in the present embodiment, a part which does not correspond to the first number is calculated and stored in the output memory 1511 in advance in order to operate at high speed, thereby not performing this complicated calculation each time of the acquisition operation, thus it attempt to speedup the acquisition operation.

The first number rewriting function 1505 is a function for rewriting the first number as to memory elements to be loaded from now in the memory element information 106, for a position corresponding to the first number of the output memory 1511 described in the first position information 1504 (it is the part XXXXXXXX in above-described example and data from $24^{th}$ bit to $56^{th}$ bit). For example, the output memory 1511 is implemented as 32 bit one-port memory, it operates so that data from $24^{th}$ bit to $32^{th}$ bit of the output memory 1511 are rewritten at a first time and data from $33^{th}$ bit to $56^{th}$ bit of the output memory 1511 are rewritten at a second time. Thus, it is possible to rewrite the values the minimum number of times and load the logical values of the memory elements having the written first number. There is a case that it can rewrites a position at which the first number is stored in the output memory 1511 by one rewriting operation to the output memory 1511, by devising an address signal provided by the memory control unit 1510 and a recording starting position in the initial value information 1502. For example, in the above-described example, controlling so that the initial value information 1502 is stored from the address 8 and when the memory control unit 1510 starts operation it starts from the address 8 causes the part corresponding to the first number in the output memory 1511 to be from $33^{th}$ bit to $64^{th}$ bit, thus it is possible to rewrite all data at one rewriting operation and to perform the acquisition process at higher speed. Moreover, if a dual port memory can be used as the output memory 1511, it is possible to perform the load of data from the output memory 1511 and the rewriting of the first number in parallel. Thereby, the rewriting time by first number rewriting function 1505 can become apparently 0 and it is possible to speed up the acquisition operation.

The extraction function 1506 obtains positions of desired memory elements in the input memory 1509 from the second number stored in the memory element information 106 and the second position information 1503, and extracts the logical values of the desired memory elements from the positions at one time of extracting operation. For example, if a dual port memory can be used as the input memory 1509, when corresponding to the data width on a control IF 1507 side of the input memory 1509 with the data width of the control IF 1507 in order to maximize the data transfer rate (improve the efficiency to the best) between the entire control function 1500 and the loading control unit 103, it is possible to load at higher speed. For example, if the control IF 1507 is a 32 bit PCI bus, it makes the data width on the control IF 1507 side of the input memory 1509 32 bit thereby, it is possible to efficiently perform data transfer between the entire control function 1500 and the loading control unit 103.

Next, with respect to the control IF 1507 and the central control function 109, operations thereof will be described in details.

The control IF 1507 is a function for controlling the acquisition unit 1508 in accordance with the instruction from the entire control function 1500. For example, if the entire control function 1500 is implemented by a general computer having CPU, the control IF 1507 is an IF for connecting with the computer, specifically, an IF which can receive from and transfer to PCI bus, PCI express bus, USB, IEEE1394 and Ethernet (registered trademark in Japan) and so on.

The central control function 109 is a function for controlling entire blocks and, first, stores values of the initial value information 1502 into the output memory 1511 after activating the semiconductor device 100. At this time, it may store any data in a part corresponding to the first number since it is rewritten for each loading of the memory elements.

The central control function 109, when the operation of the semiconductor device 100 stops, makes the memory element calculation function 107 operate to generate the memory element information 106. Next, the central control function 109 rewrites the first number in the memory element information 106 to the first number in the output memory 1511 using the first number rewriting function 1505. Then, the central control function 109 controls the output memory 1511 and the input memory 1509 using the memory control unit 1510 to provide, to the loading unit 101, the data to load the logical values of the memory elements from the loading unit 101 as well as to cause the logical values of the memory elements output from the loading unit 101 to be stored into the input memory 1509. Next, the central control function 109 extracts the logical values of the desired memory elements via the extraction function 1506 from the input memory 1509. Finally, the central control function 109 inputs the extracted logical values of all memory elements to the logical value calculation function 108 and finally calculates the logical value of the desired signal.

Generally, the loading control unit 103 is generally implemented by hardware in order to operate at high speed, and the entire control function 1500 is implemented as a program on a computer but, it is not limited to this manner. The circuit information 105, the signal information 104 and the logical value calculation function 108 are same as those in the preferred embodiment, and the number database 1300 is same as that in the fifth embodiment.

Figure 20:
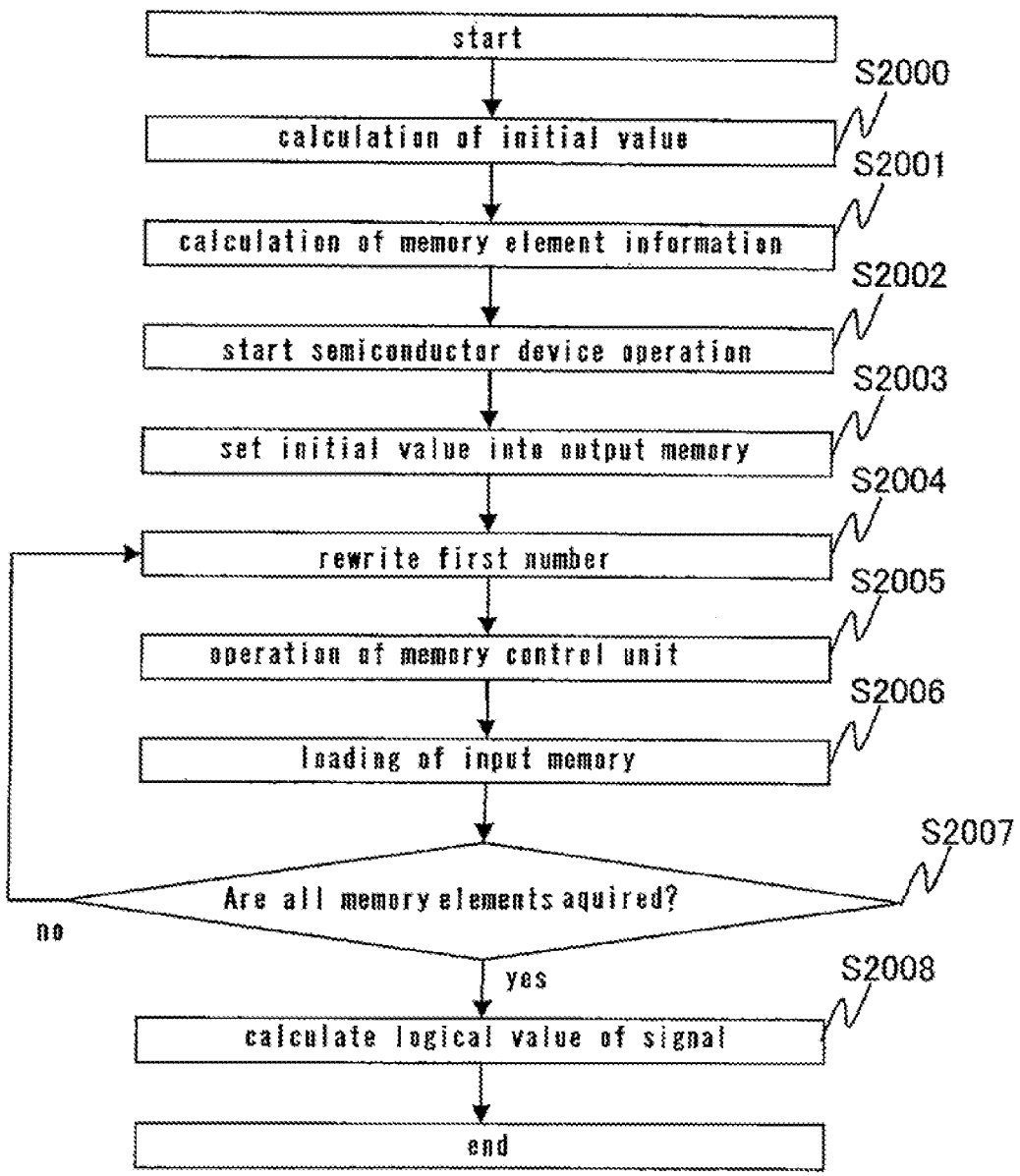
FIG. 20 is a flowchart showing an operation for carrying out a sixth invention pertaining to the present application.

Next, an entire operation of the present embodiment will be described in details with reference to flowcharts of FIG. 15 and FIG. 20.

The step S2000 is a step in which the initial value calculation function 1501 outputs, based on the loading unit control information 102, initial value information 1502 which is data for 1 clock cycle to be provided to the loading unit 101 in order to load the logical values of the memory elements, first position information 1504 indicating the area where the first number of the output memory 1511 are stored, and second position information 1503 in which positions corresponding to each of the second numbers in the input memory 1509 are stored.

The step S2001 is a step in which the memory element calculation function 107 acquires the list of signals to be acquired from the signal information 109, calculates its logical formula based on the circuit information 105, retrieves the first number and the second number of the memory elements represented in the logical formula from the number database 1300, and generates the memory element information 106.

The step S2002 is a step in which the semiconductor device 100 starts operation, and temporally stops the operation at the timing of requiring to acquire the logical value of the signal. More specifically, in this step, a power is turn on so that the semiconductor device 100 can operate and, a configuration of FPGA is performed if the semiconductor device 100 is configured by the FPGA. After that, at the timing of requiring to acquire the logical value of the signal, it makes the operation of the semiconductor device 100 stop temporally, for example, by stopping the clock signal supply. Here, an order of the steps S2000 to S2002 may be changed so that any step thereof is performed at first.

The step S2003 is a step in which the central control function 109 writes the content of the initial value information 1502 into the output memory 1511, and enables the loading unit 101 to start the operation.

The step S2004 is a step in which the central control function 109 calculates one first number relating to a memory element of which the loading control unit 103 has not acquired the logical value, among the memory elements described in the memory element information 106, instructs it to the first number rewriting function 1505. The first number rewriting function 1505 rewrites the part corresponding to the first number in the output memory 1511 in accordance with the instruction.

The step S2005 is a step in which the central control function 109 makes the memory control unit 1510 operate via the control IF 1507, provides the control content described in the output memory 1511 to the loading unit 101, further stores the logical value of the memory element output from the loading unit 101 into the input memory 1509.

The step S2006 is a step in which the central control function 109 makes the extraction function 1506 operate, and acquires the logical value of the memory element stored in the input memory 1509 based on the second number of its memory element and the second position information 1503.

The step S2007 is a step in which the central control function 109 determines whether the logical values of all memory elements described in the memory element information 106 has been acquired, and determines to transfer the step S2008 when acquired and to return the step S2004 when not acquired.

The step S2008 is a step in which the central control function 109 provides the logical values of all memory elements described in the memory element information 106 to the logical value calculation function 108, and calculates the logical values for all signals described in the memory element information 106.

Next, advantages of the present embodiment will be described.

In the present embodiment, since it is configured so that a control of the input terminal of the loading unit 101 which is needed to load the logical values of the memory elements has been stored for one clock cycle, it rewrites only a part which is different according to memory elements (first number in the present embodiment) when acquiring the logical values of the memory elements, and it causes them to operate so as to control the loading unit 101 by only loading the logical value from the output memory 1511. Thereby, it has an advantage of speeding up the acquisition operation.

Moreover, the acquisition unit 1508 is configured simply, further, the output memory 1511 and the input memory 1509 are directly connected with the loading unit 101, thus it has an advantage that it is possible to speed up the control of the loading unit 101. This is achieved by storing data for each clock cycle in the output memory 1511, and recording the values output from the loading unit 101 for each clock cycle in the input memory 1509.

Further, the second, third and fourth embodiments can be applied to the present embodiment.

While the present invention has been described in association with some preferred form and embodiments, it will be understood that these aspects and embodiments are merely illustrative and there is no intent to limit the invention by such disclosure. It will be readily apparent to those skilled in the art after reading the specification herein that many changes and replacements with equivalent elements and technologies are easily processed, however it is apparent that such changes and replacements are not departing from the spirit and scope of the following claims.

According to the present invention, it can be applied to a semiconductor verification apparatus, or a system analogizing with it.

What is claimed is:

1. A semiconductor verification apparatus for loading a logical value of a signal in a semiconductor device using the semiconductor device which comprises loading means capable of loading from outside logical values of memory elements in the semiconductor device, the apparatus comprising:
    memory element calculation means for calculating a logical formula for calculating the logical value of the signal described in the signal information treating the states of the memory elements being used as logical variable number therein, based on signal information in which the signal in the semiconductor device is described and circuit information in which a logical structure in the semiconductor device and a relation of connection thereof are described;
    loading control means for controlling the loading means to acquire only the logical values of the memory elements existing in the logical formula calculated by said memory element calculation means of the semiconductor device;
    logical value calculation means for calculating the logical value of the signal described in the signal information based on the logical formula calculated by the memory element calculation means and the logical values of the memory elements acquired by the loading control means; and
    central control means for controlling the memory element calculation means, the loading control means and the logical value calculation means to obtain the logical value of the signal described in the signal information.

2. The semiconductor verification apparatus according to claim 1, further comprising clock control means for controlling a clock signal of the semiconductor device,
    wherein the clock control means has one or more of functions among the functions of stopping a clock supply
    (1) in a case that the logical value of the signal existing in the semiconductor device becomes a specific value,
    (2) in a case that the logical value of the signal existing in the semiconductor device becomes within a specific range or outside the range,
    (3) in a case of occurring the case (1) or (2) designated number of times,
    (4) in a case of occurring a break in an apparatus operating by a software in the semiconductor device, and
    (5) in a case of combining cases of (1) to (4) for a plurality of signals,
        wherein the central control means acquires the logical value of the signal of the signal information when stopping a clock signal supply to the semiconductor device.

3. The semiconductor verification apparatus according to claim 1, further comprising
    acquisition order calculation means for outputting acquisition order information for determining an order of the memory elements to be acquired by the loading control means.

4. The semiconductor verification apparatus according to claim 3, wherein the acquisition order calculation means, when determining the acquisition order information, arranges logical formulae for each of signals calculated by the memory element calculation means in ascending order of the number of logic stages between the signals and each of memory elements, memory elements being used as the logical variable numbers therein.

5. The semiconductor verification apparatus according to claim 3, wherein the acquisition order calculation means, when determining the acquisition order information, makes up an equivalent circuit using three circuits of a two input AND circuit, a two input OR circuit and a NOT circuit, and arranges logical formulae for each of signals calculated by the memory element calculation means in ascending order of the number of logic stages between the signals and each of memory elements, memory elements being used as the logical variable numbers therein.

6. The semiconductor verification apparatus according to claim 3, wherein the acquisition order calculation means, when determining the acquisition order information, transforms logical formulae for each of signals calculated by the memory element calculation means into a minimum logical AND form or a minimum logical OR form, memory elements being used as the logical variable numbers therein,
    arranges them in ascending order of the number of logical variable numbers of each term, where in descending order of the number of appearances of the logical variable numbers in a case that the numbers of logical variable numbers are same.

7. The semiconductor verification apparatus according to claim 3, wherein the acquisition order calculation means, when determining the acquisition order information, transforms logical formulae for each of signals calculated by the memory element calculation means into a minimum logical AND form or a minimum logical OR form, memory elements being used as the logical variable numbers therein,
    arranges them in descending order of sum of the number of logical variable numbers which can be deleted at the time of fixing the values of each of the logical variable numbers.

8. The semiconductor verification apparatus according to claim 7, wherein, in a case that the logical values of a plurality of memory elements are capable of loading by one action for the loading means, the order is evaluated by adding the number of logical variable numbers which can be deleted for the memory elements capable of loading by one action.

9. The semiconductor verification apparatus according to claim 3, wherein the central control means re-calculates the acquisition order by the acquisition order calculation means with each time when the loading control means acquires the logical values of the memory elements of the semiconductor device.

10. A semiconductor verification apparatus for loading, from a semiconductor device in which a plurality of memory elements existing in the semiconductor device are distinguished by a first number and a second number, logical values of signals thereof, the apparatus comprising:
    memory element calculation means for calculating a logical formulae in which the memory elements are used as logical variable numbers and the logical values of the signals described in signal information based on the signal information in which the signal in the semiconductor device is described and circuit information in which a logical structure in the semiconductor device and a relation of connection thereof are described;

loading means which is implemented in the semiconductor device, provides a value of the first number, and provides the logical values of the memory elements corresponding to the first number to outside of the semiconductor device by being controlled based on the loading means control information;

a first memory directly connected with an input terminal of the loading means;

a second memory directly connected with an output terminal of the loading means, and stored the values for each of clock cycles at the output terminal of the loading means including the logical values of the memory elements corresponding to the second number;

initial value calculation means for calculating, based on loading means control information describing a control method for the loading means, initial value information which are values for each clock cycle stored in said first memory, provided to the loading means to control the same, first position information of the first number in the first memory, and second position information storing a position in the second memory corresponding to each second number;

first number rewriting means for writing only the first number into the first memory based on the first position information;

extraction means for obtaining a part corresponding to the second number in the second memory based on the second number and the second position information, and extracting the logical values of the memory elements corresponding to the second number therefrom by one extraction operation;

logical value calculation means for calculating the logical values of each of the signals described in the signal information based on the logical formulae calculated by the memory element calculation means and the logical values of the memory elements acquired by the loading means; and central control means for controlling the memory element calculation means, the loading means, the logical value calculation means and the first number rewriting means to obtain the logical values of the signals described in the signal information.

11. The semiconductor verification apparatus according to claim 1, wherein the semiconductor device is an FPGA having the loading means.

12. A semiconductor verification method for verifying a semiconductor device by loading a logical value of a signal in the semiconductor device using the semiconductor device which comprises a loading unit capable of loading from outside logical values of memory elements in the semiconductor device, the method including:

calculating, by a memory element calculation unit, a logical formula for calculating the logical value of the signal described in signal information, the memory elements being used as logical variables therein, based on the signal information in which the signal in the semiconductor device is described and circuit information in which a logical structure in the semiconductor device and a relation of connection thereof are described;

controlling, by a loading control unit, the loading unit to acquire the logical values of the memory elements of the semiconductor device;

calculating the logical value of the signal described in the signal information based on the logical formula calculated by the memory element calculation unit and the logical values of the memory elements acquired by the loading control unit; and controlling, by a central control unit, the memory element calculation unit, the loading control unit and the logical value calculation unit to obtain the logical value of the signal described in the signal information.

13. The semiconductor verification method according to claim 12, further including controlling, by a clock control unit, a clock signal of the semiconductor device, wherein the clock control unit has one or more of functions among the functions of stopping a clock supply (1) in a case that the logical value of the signal existing in the semiconductor device becomes a specific value, (2) in a case that the logical value of the signal existing in the semiconductor device becomes within a specific range or outside the range, (3) in a case of occurring the case (1) or (2) designated number of times, (4) in a case of occurring a break in an apparatus operating by a software in the semiconductor device, and (5) in a case of combining cases of (1) to (4) for a plurality of signals, wherein the central control unit acquires the logical value of the signal of the signal information when stopping a clock signal supply to the semiconductor device.

14. The semiconductor verification method according to claim 12, wherein an acquisition order calculation unit outputs acquisition order information for determining an order of the memory elements to be acquired by the loading control unit.

15. The semiconductor verification method according to claim 14, wherein the acquisition order calculation unit, when determining the acquisition order information, arranges logical formulae for each of signals calculated by the memory element calculation unit in ascending order of the number of logic stages between the signals and each of memory elements, memory elements being used as the logical variable numbers therein.

16. The semiconductor verification method according to claim 14, wherein the acquisition order calculation unit, when determining the acquisition order information, makes up an equivalent circuit using three circuits of a two input AND circuit, a two input OR circuit and a NOT circuit, and arranges logical formulae for each of signals calculated by the memory element calculation function in ascending order of the number of logic stages between the signals and each of memory elements, memory elements being used as the logical variable numbers therein.

17. The semiconductor verification method according to claim 14, wherein the acquisition order calculation unit, when determining the acquisition order information, transforms logical formulae for each of signals calculated by the memory element calculation unit into a minimum logical AND form or a minimum logical OR form, memory elements being used as the logical variable numbers therein, arranges them in ascending order of the number of logical variable numbers of each term, where in descending order of the number of appearances of the logical variable number in a case that the numbers of logical variable numbers are same.

18. The semiconductor verification method according to claim 14, wherein the acquisition order calculation unit, when determining the acquisition order information, transforms logical formulae for each of signals calculated by the memory element calculation unit into a minimum logical AND form or a minimum logical OR form, memory elements being used as the logical variable numbers therein,
  arranges them in descending order of sum of the number of logical variable numbers which can be deleted at the time of fixing the values of each of the logical variable numbers.

19. The semiconductor verification method according to claim 18, wherein, in a case that the logical values of a plurality of memory elements are capable of loading by one action by the loading unit, the order is evaluated by adding the number of logical variable number which can be deleted, for the memory elements capable of loading by one action.

20. The semiconductor verification method according to claim 14, wherein the central control unit re-calculates the acquisition order by the acquisition order calculation unit with each time when the loading control unit acquires the logical values of the memory elements of the semiconductor device.

21. A semiconductor verification method for loading, from a semiconductor device in which a plurality of memory elements existing in the semiconductor device are distinguished by a first number and a second number, logical values of signals thereof, wherein
  a memory element calculation unit calculates a logical formulae in which the memory elements are used as logical variable numbers and the logical values of the signals described in signal information based on the signal information in which the signal in the semiconductor device is described and circuit information in which a logical structure in the semiconductor device and a relation of connection thereof are described;
  a loading unit is implemented in the semiconductor device, which provides a value of the first number, and by being controlled based on the device control information, it provides the logical values of the memory elements corresponding to the first number to outside of the semiconductor device by being controlled based on device control information;
  an initial value calculation unit calculates, based on a first memory directly connected with an input terminal of the loading unit, a second memory directly connected with an output terminal of the loading unit, and stored the values for each of clock cycles at the output terminal of the loading unit including the logical values of the memory elements corresponding to the second number, and initial value information which are values of reach clock cycle stored in the first memory and being provided to the loading unit to control the same based on the loading means control information describing a control method of said loading means, first position information of the first number in the first memory, and second position information storing a position in the second memory corresponding to each second number;
  a first number rewriting unit writes only the first number into the first memory based on the first position information;
  an extraction unit obtains a part corresponding to the second number in the second memory based on the second number and the second position information, and extracts the logical values of the memory elements corresponding to the second number therefrom by one extraction operation;
  a logical value calculation unit calculates the logical values of each of the signals described in the signal information based on the logical formulae calculated by the memory element calculation unit and the logical values of the memory elements acquired by the loading unit; and
  a central control unit controls the memory element calculation unit, the loading unit, the logical value calculation unit and the first number rewriting unit to obtain the logical values of the signals described in the signal information.

22. A semiconductor verification program, recorded on a non-transitory computer-readable medium, for loading a logical value of a signal in a semiconductor device using the semiconductor device which comprises a loading unit capable of loading from outside logical values of memory elements in the semiconductor device, the semiconductor verification program which when executed on a computer causes the computer to execute:
  a memory element calculation unit for calculating a logical formula for calculating the logical value of the signal described in the signal information, the memory elements being used as logical variable number therein, based on signal information in which the signal in the semiconductor device is described and circuit information in which a logical structure in the semiconductor device and a relation of connection thereof are described;
  a loading control unit for controlling the loading unit to acquire the logical values of the memory elements of the semiconductor device;
  a logical value calculation unit for calculating the logical value of the signal described in the signal information based on the logical formula calculated by the memory element calculation unit and the logical values of the memory elements acquired by the loading control unit; and
  a central control unit for controlling the memory element calculation unit, the loading control unit and the logical value calculation unit to obtain the logical value of the signal described in the signal information.

23. A semiconductor verification program, recorded on a non-transitory computer readable medium, for loading from a semiconductor device in which a plurality of memory elements existing in the semiconductor device are distinguished by a first number and a second number, logical values of signals thereof, the semiconductor verification program which when executed on a computer causes the computer to execute:
  a memory element calculation unit for calculating a logical formulae in which the memory elements are used as logical variable numbers, the logical values of the signals described in signal information, and memory element thereof based on the signal information in which the signal in the semiconductor device is described and circuit information in which a logical structure in the semiconductor device and a relation of connection thereof are described;
  a loading unit which is implemented in the semiconductor device, provides a value of the first number, and provides the logical values of the memory elements corresponding to the first number to outside of the semiconductor device by being controlled based on device control information;
  a first memory directly connected with an input terminal of the loading unit;
  a second memory directly connected with an output terminal of the loading unit, and stored the values for each of clock cycles at the output terminal of the loading unit including the logical values of the memory elements corresponding to the second number;

an initial value calculation unit for calculating, based on loading means control information describing a control method for the loading unit, initial value information which are values for each clock cycle stored in the first memory, and by being provided to the loading means to control the same, first position information of the first number in the first memory, and second position information storing a position in the second memory corresponding to each second number;

a first number rewriting unit for writing only the first number into the first memory based on the first position information;

an extraction unit for obtaining a part corresponding to the second number in the second memory based on the second number and the second position information, and extracting the logical values of the memory elements corresponding to the second number therefrom by one extraction operation;

a logical value calculation unit for calculating the logical values of each of the signals described in the signal information based on the logical formulae calculated by the memory element calculation unit and the logical values of the memory elements acquired by the loading unit; and a central control unit for controlling the memory element calculation unit, the loading unit, the logical value calculation unit and the first number rewriting function to obtain the logical values of the signals described in the signal information.

\* \* \* \* \*